United States Patent
Kim

(10) Patent No.: US 12,062,617 B2
(45) Date of Patent: Aug. 13, 2024

(54) SEMICONDUCTOR PACKAGE

(71) Applicant: Samsung Electronics Co., Ltd., Suwon-si (KR)

(72) Inventor: Joonsung Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 219 days.

(21) Appl. No.: 17/562,127

(22) Filed: Dec. 27, 2021

(65) Prior Publication Data

US 2022/0392843 A1 Dec. 8, 2022

(30) Foreign Application Priority Data

Jun. 2, 2021 (KR) .................. 10-2021-0071455

(51) Int. Cl.
| | |
|---|---|
| *H01L 23/538* | (2006.01) |
| *H01L 23/00* | (2006.01) |
| *H01L 23/31* | (2006.01) |
| *H01L 23/34* | (2006.01) |
| *H01L 23/522* | (2006.01) |

(52) U.S. Cl.
CPC ...... *H01L 23/5383* (2013.01); *H01L 23/3121* (2013.01); *H01L 23/34* (2013.01); *H01L 23/5226* (2013.01); *H01L 23/5386* (2013.01); *H01L 24/08* (2013.01); *H01L 23/3171* (2013.01); *H01L 2224/08235* (2013.01)

(58) Field of Classification Search
CPC . H01L 23/5383; H01L 23/3121; H01L 23/34; H01L 23/5226; H01L 23/5386; H01L 24/08; H01L 23/3171; H01L 2224/08235
See application file for complete search history.

(56) References Cited

U.S. PATENT DOCUMENTS

| | | |
|---|---|---|
| 8,629,354 B2 | 1/2014 | Cho et al. |
| 8,975,711 B2 | 3/2015 | Otremba et al. |
| 9,633,974 B2 | 4/2017 | Zhai et al. |
| 9,730,329 B2 | 8/2017 | Yu et al. |
| 10,163,860 B2 | 12/2018 | Hsu et al. |

(Continued)

*Primary Examiner* — Fernando L Toledo
*Assistant Examiner* — Neil R Prasad
(74) *Attorney, Agent, or Firm* — Muir Patent Law, PLLC

(57) ABSTRACT

A semiconductor package includes a first semiconductor chip including a first semiconductor substrate and a first chip pad on a first bottom surface of the first semiconductor substrate, a second semiconductor chip including a second semiconductor substrate and a second chip pad on a second top surface of the second semiconductor substrate, a lower redistribution structure provided under the first semiconductor chip and the second semiconductor chip, the lower redistribution structure including a lower redistribution pattern, the lower redistribution pattern including a first lower redistribution via pattern contacting the first chip pad, a molding layer covering the first semiconductor chip and the second semiconductor chip, an upper redistribution structure including an upper redistribution pattern, the upper redistribution pattern including a first upper redistribution via pattern connected to the second chip pad, and a conductive connection structure electrically connecting the lower redistribution pattern to the upper redistribution pattern.

20 Claims, 17 Drawing Sheets

(56) References Cited

U.S. PATENT DOCUMENTS

| | | |
|---|---|---|
| 10,643,919 B2 | 5/2020 | Oh et al. |
| 2018/0033770 A1* | 2/2018 | Hsu .................. H01L 25/50 |
| 2018/0138127 A1 | 5/2018 | Lee et al. |
| 2019/0371781 A1* | 12/2019 | Huang ............... H01L 21/486 |
| 2020/0266160 A1 | 8/2020 | Yu et al. |
| 2021/0159200 A1* | 5/2021 | Lee ................ H01L 23/49838 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2021-0071455, filed on Jun. 2, 2021, in the Korean Intellectual Property Office, the disclosure of which is incorporated by reference herein in its entirety.

BACKGROUND

The inventive concept relates to a semiconductor package, and more particularly, to a semiconductor package including a plurality of semiconductor chips.

Recently, there is a tendency in the electronics industry to provide compact, lightweight, and multi-functionalized electronic products having high speed and high performance at low price. Also, a multi-chip package technology capable of providing at least two semiconductor chips in a single package has been widely used. In the case of multi-chip packages, an electrical connection structure between a plurality of semiconductor chips in a semiconductor package significantly influences the electrical characteristics of the semiconductor package.

SUMMARY

The inventive concept provides a semiconductor package including a plurality of semiconductor chips.

According to an aspect of the inventive concept, there is provided a semiconductor package including a first semiconductor chip including a first semiconductor substrate and a first chip pad, the first semiconductor substrate including a first bottom surface and a first top surface that is opposite to the first bottom surface, and the first chip pad being on the first bottom surface of the first semiconductor substrate; a second semiconductor chip including a second semiconductor substrate and a second chip pad, the second semiconductor substrate including a second bottom surface and a second top surface that is opposite to the second bottom surface, and the second chip pad being on the second top surface of the second semiconductor substrate; a lower redistribution structure including a top surface, a lower redistribution insulating layer, and a lower redistribution pattern, the top surface having mounted thereon the first semiconductor chip and the second semiconductor chip, the lower redistribution pattern including a first lower redistribution via pattern contacting the first chip pad of the first semiconductor chip; a molding layer covering the first semiconductor chip and the second semiconductor chip; an upper redistribution structure including an upper redistribution insulating layer and an upper redistribution pattern including an upper redistribution line pattern and a first upper redistribution via pattern, the upper redistribution line pattern extending along a top surface of the molding layer, and the first upper redistribution via pattern extending from the top surface of the molding layer toward the second semiconductor chip and being connected to the second chip pad of the second semiconductor chip; and a conductive connection structure electrically connecting the lower redistribution pattern of the lower redistribution structure to the upper redistribution pattern of the upper redistribution structure. The first upper redistribution via pattern has a tapered shape having a horizontal width decreasing toward the second chip pad of the second semiconductor chip, and the first lower redistribution via pattern has a tapered shape having a horizontal width decreasing toward the first chip pad of the first semiconductor chip.

According to an aspect of the inventive concept, there is provided a semiconductor package including a first semiconductor chip including a first semiconductor substrate and a first chip pad, the first semiconductor substrate including a first bottom surface and a first top surface that is opposite to the first bottom surface, and the first chip pad being on the first bottom surface of the first semiconductor substrate; a second semiconductor chip including a second semiconductor substrate and a second chip pad, the second semiconductor substrate including a second bottom surface and a second top surface that is opposite to the second bottom surface, and the second chip pad being on the second top surface of the second semiconductor substrate; a lower redistribution structure including a top surface, a lower redistribution insulating layer, and a lower redistribution pattern, the top surface having mounted thereon the first semiconductor chip and the second semiconductor chip, the lower redistribution pattern including a first lower redistribution via pattern contacting the first chip pad of the first semiconductor chip; a molding layer covering the first semiconductor chip and the second semiconductor chip; an upper redistribution structure including an upper redistribution insulating layer and an upper redistribution pattern including an upper redistribution line pattern and a first upper redistribution via pattern, the upper redistribution line pattern extending along a top surface of the molding layer, and the first upper redistribution via pattern extending from the top surface of the molding layer and being connected to the second chip pad of the second semiconductor chip; and a conductive connection structure electrically connecting the lower redistribution pattern of the lower redistribution structure to the upper redistribution pattern of the upper redistribution structure, wherein a horizontal width of the second chip pad of the second semiconductor chip is greater than a horizontal width of the first chip pad of the first semiconductor chip, and a horizontal width of the first upper redistribution via pattern is greater than a horizontal width of the first lower redistribution via pattern.

According to a further aspect of the inventive concept, there is provided a semiconductor package including a lower package and an upper package stacked on the lower package. The lower package includes a first semiconductor chip including a first semiconductor substrate and a first chip pad, the first semiconductor substrate including a first bottom surface and a first top surface that is opposite to the first bottom surface, and the first chip pad being on the first bottom surface of the first semiconductor substrate; a second semiconductor chip including a second semiconductor substrate and a second chip pad, the second semiconductor substrate including a second bottom surface and a second top surface that is opposite to the second bottom surface, and the second chip pad being on the second top surface of the second semiconductor substrate and having a horizontal width greater than a horizontal width of the first chip pad; a lower redistribution structure including a top surface, a lower redistribution insulating layer, and a lower redistribution pattern, the top surface having mounted thereon the first semiconductor chip and the second semiconductor chip, the lower redistribution pattern including a first lower redistribution via pattern contacting the first chip pad of the first semiconductor chip; a connection substrate on the top surface of the lower redistribution structure and including a substrate base and a conductive connection structure, the substrate base having an accommodation space accommodating the first semiconductor chip and the second semiconductor chip therein, and the conductive connection structure passing through the substrate base; a molding layer filling the accommodation space of the substrate base, covering the first semiconductor chip and the second semiconductor chip, and including a thermosetting material; and an upper redistribution structure including an upper redistribution insulating layer covering a top surface of the molding layer and an upper redistribution pattern electrically connected to the lower redistribution pattern through the conductive connection structure, the upper redistribution pattern including an upper redistribution line pattern extending along the top surface of the molding layer, a first upper redistribution via pattern extending from the top surface of the molding layer to the second chip pad of the second semiconductor chip, and a second upper redistribution via pattern extending from the top surface of the molding layer to the conductive connection structure of the connection substrate. The upper package includes a package substrate and a third semiconductor chip on the package substrate. A maximum horizontal width of the first upper redistribution via pattern is greater than a maximum horizontal width of the first lower redistribution via pattern, the first upper redistribution via pattern has a tapered shape having a horizontal width decreasing toward the second chip pad of the second semiconductor chip, and the first lower redistribution via pattern has a tapered shape having a horizontal width decreasing toward the first chip pad of the first semiconductor chip.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
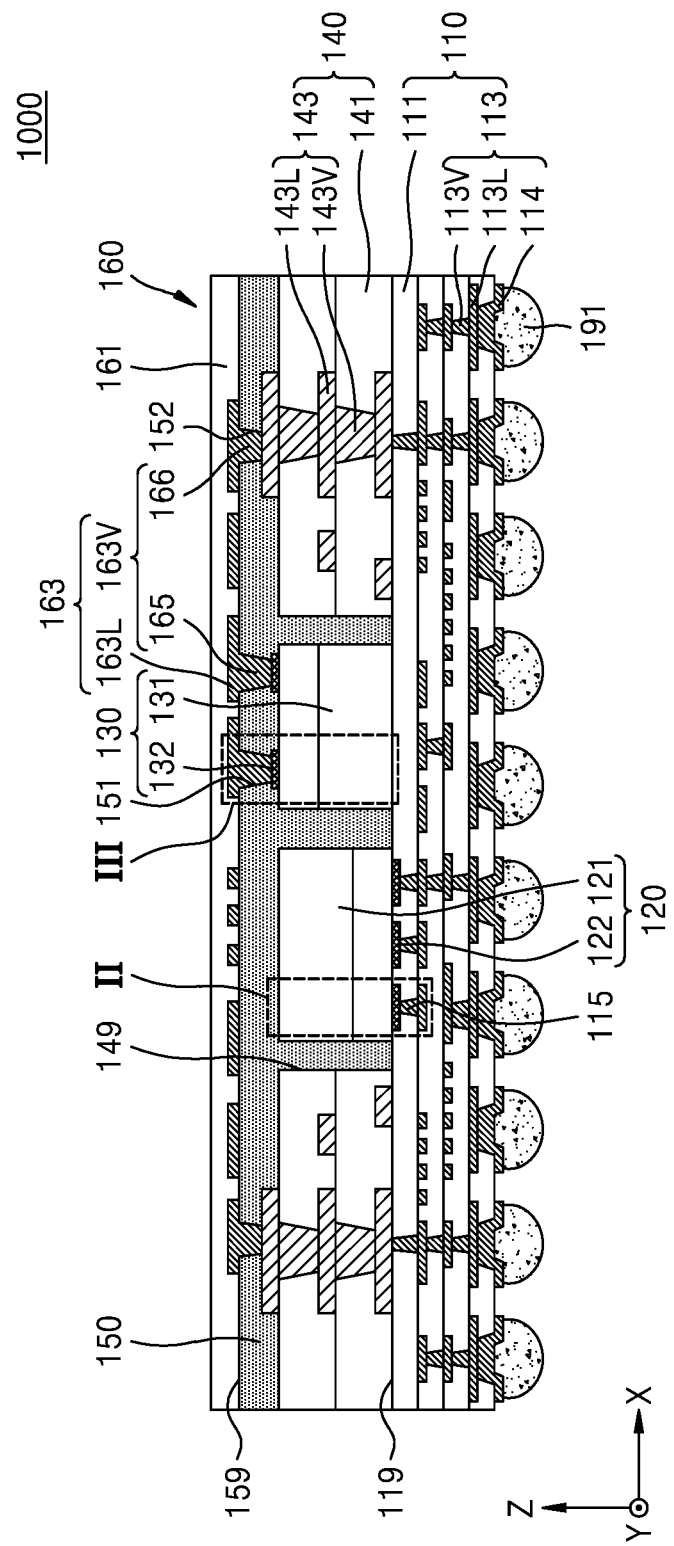
FIG. 1 is a cross-sectional view of a semiconductor package according to example embodiments.

Hereinafter, embodiments will be described with reference to the attached drawings. In the drawings, like numerals denote like elements and redundant descriptions thereof will be omitted.

Figure 2:
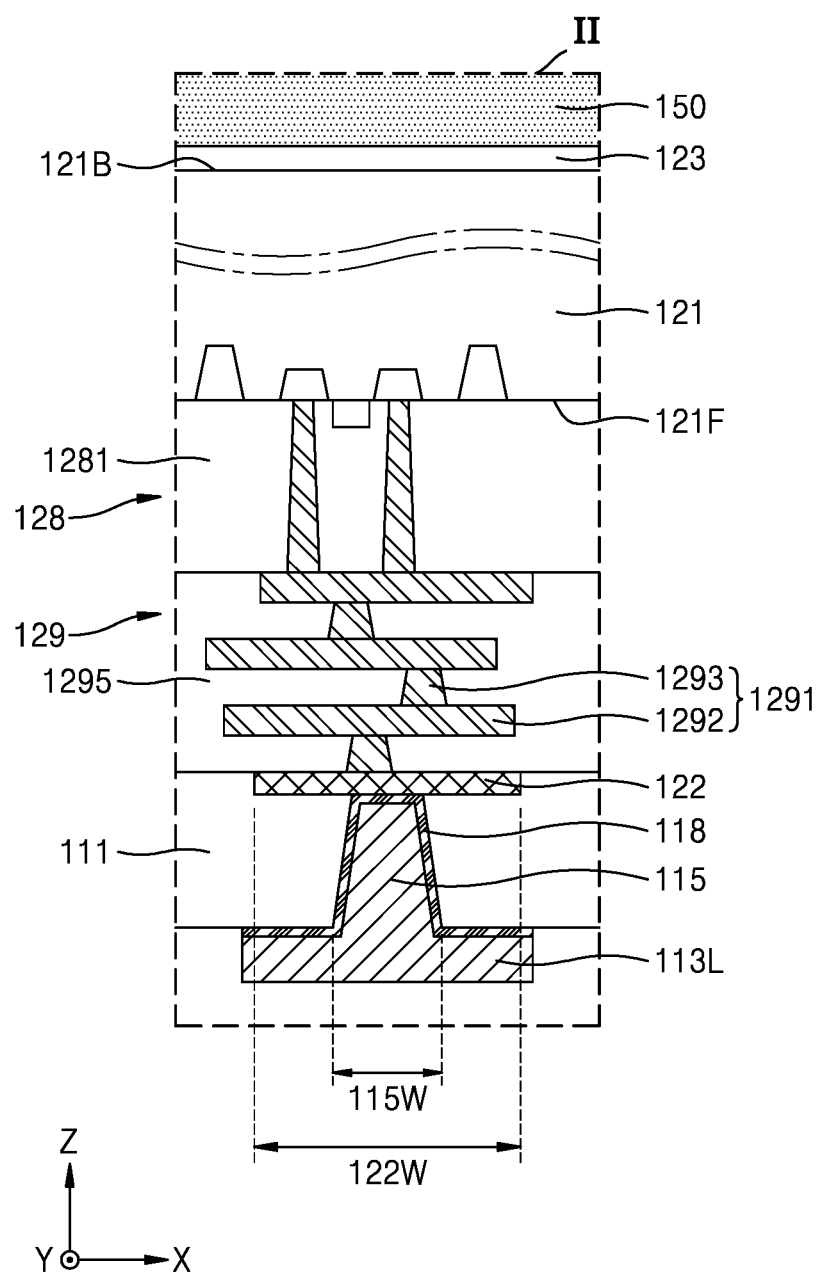
FIG. 2 is an enlarged view of region II in FIG. 1.
Figure 3:
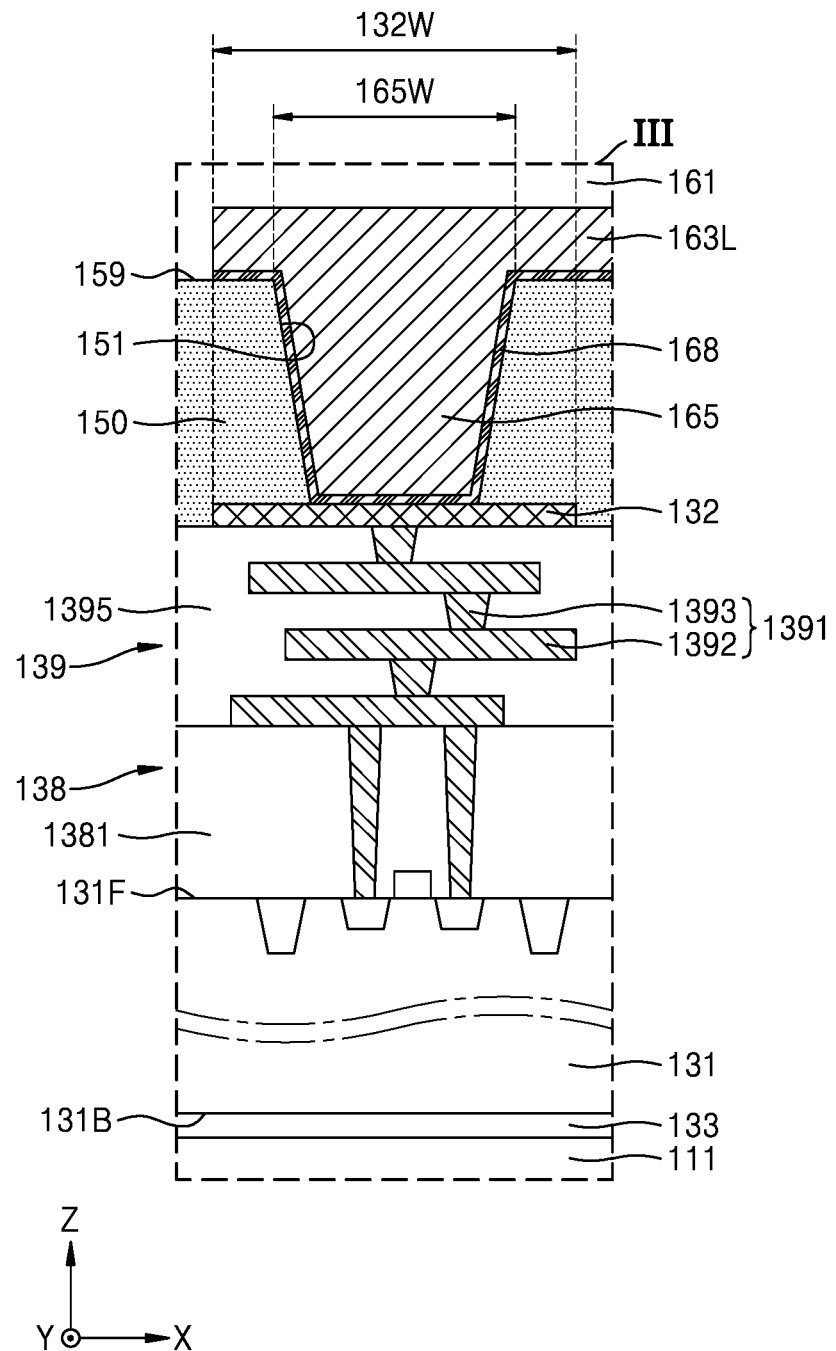
FIG. 3 is an enlarged view of region III in FIG. 1.

FIG. 1 is a cross-sectional view of a semiconductor package 1000 according to example embodiments. FIG. 2 is an enlarged view of region II in FIG. 1. FIG. 3 is an enlarged view of region III in FIG. 1.

Referring to FIGS. 1 through 3, the semiconductor package 1000 may include a lower redistribution structure 110, a first semiconductor chip 120, a second semiconductor chip 130, a connection substrate 140, a molding layer 150, and an upper redistribution structure 160.

The semiconductor package 1000 may correspond to a fan-out semiconductor package, in which the footprint of the lower redistribution structure 110 is greater than the footprint of both of the first and second semiconductor chips 120 and 130. The footprint of the lower redistribution structure 110 may be the same as the footprint of the semiconductor package 1000.

The lower redistribution structure 110 may function as a package substrate on which the first semiconductor chip 120 and the second semiconductor chip 130 are mounted. The lower redistribution structure 110 may include a top surface on which the first semiconductor chip 120 and the second semiconductor chip 130 are mounted. Hereinafter, a direction parallel with the top surface 119 of the lower redistribution structure 110 is defined as a horizontal direction (e.g., an X direction and/or a Y direction), and a direction perpendicular to the top surface 119 of the lower redistribution structure 110 is defined as a vertical direction (e.g., a Z direction). A horizontal width of an element may refer to a length in the horizontal direction (e.g., the X direction and/or the Y direction), and a vertical height of the element may refer to a length in the vertical direction (e.g., the Z direction).

The lower redistribution structure 110 may include a plurality of lower redistribution insulating layers 111 and a lower redistribution pattern 113.

The lower redistribution insulating layers 111 may be stacked on each other in the vertical direction (e.g., the Z direction). The lower redistribution insulating layers 111 may be formed of a material film including an organic compound. For example, each of the lower redistribution insulating layers 111 may be formed of a photo imageable dielectric (PID), an ajinomoto build-up film (ABF), or photosensitive polyimide (PSPI). In example embodiments, a total vertical height of the lower redistribution insulating layers 111 may be about 40 μm to about 80 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The lower redistribution pattern 113 may include a plurality of lower redistribution line patterns 113L, which are on at least one selected from the top and bottom surfaces of each of the lower redistribution insulating layers 111, and a plurality of lower redistribution via patterns 113V, which extend through at least one of the lower redistribution insulating layers 111. For example, as shown in FIG. 1, the lower redistribution line patterns 113L may extend along the bottom surface of at least one of the lower redistribution insulating layers 111. The lower redistribution via patterns 113V may electrically connect the lower redistribution line patterns 113L with each other. The lower redistribution line patterns 113L may be at different levels in the vertical direction (e.g., the Z direction).

At least some of the lower redistribution line patterns 113L may be respectively integrally formed together with some of the lower redistribution via patterns 113V. For example, some of the lower redistribution line patterns 113L may be respectively integrally formed together with some of the lower redistribution via patterns 113V which are respectively in contact with the respective top surfaces of some of the lower redistribution line patterns 113L. For example, the lower redistribution line patterns 113L and the lower redistribution via patterns 113V may be formed together using an electroplating process, which will be described with reference to FIGS. 11A to 11G. In the electroplating process, a seed metal layer may be between the lower redistribution insulating layers 111 and the lower redistribution line patterns 113L and between the lower redistribution insulating layers 111 and the lower redistribution via patterns 113V. For example, the seed metal layer may include or may be formed of at least one selected from copper (Cu), titanium (Ti), titanium tungsten (TiW), titanium nitride (TiN), tantalum (Ta), tantalum nitride (TaN), chromium (Cr), and aluminum (Al). In some embodiments, the seed metal layer may be formed using physical vapor deposition such as sputtering. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In example embodiments, each of the lower redistribution via patterns 113V may have a tapered shape having a horizontal width decreasing from the bottom thereof toward the top thereof. The horizontal width of each of the lower redistribution via patterns 113V may gradually decrease toward the top surface 119 of the lower redistribution structure 110.

The lower redistribution pattern 113 may also include an external connection pad 114 to which an external connector 191 is attached. A portion of the external connection pad 114 may extend along a surface of a lowermost lower redistribution insulating layer 111 among the lower redistribution insulating layers 111, and the other portion of the external connection pad 114 may be in an opening of the lowermost lower redistribution insulating layer 111. The external connection pad 114 may include an under bump metal to which the external connector 191 is attached. For example, the external connector 191 may include or may be a solder ball or a solder bump.

For example, the lower redistribution pattern 113 may include or may be formed of metal, such as Cu, Al, W, Ti, Ta, indium (In), molybdenum (Mo), manganese (Mn), cobalt (Co), tin (Sn), nickel (Ni), magnesium (Mg), rhenium (Re), beryllium (Be), gallium (Ga), ruthenium (Ru), and an alloy thereof.

The lower redistribution via patterns 113V of the lower redistribution structure 110 may include a first lower redistribution via pattern 115 connected to a first chip pad 122 of the first semiconductor chip 120. The first lower redistribution via pattern 115 may pass through a topmost lower redistribution insulating layer 111 among the lower redistribution insulating layers 111 and in contact with the first semiconductor chip 120. An end of the first lower redistribution via pattern 115 may be connected to the first chip pad 122 of the first semiconductor chip 120, and an opposite end of the first lower redistribution via pattern 115 may be connected to a lower redistribution line pattern 113L, which extends along the bottom surface of the topmost lower redistribution insulating layer 111.

As shown in FIG. 2, a first lower seed metal layer 118 may be between the first lower redistribution via pattern 115 and the topmost lower redistribution insulating layer 111, between the first lower redistribution via pattern 115 and the first chip pad 122, and between a lower redistribution line pattern 113L and the topmost lower redistribution insulating layer 111.

In example embodiments, the first lower redistribution via pattern 115 may have a tapered shape having a horizontal width 115W decreasing upward. The horizontal width 115W of the first lower redistribution via pattern 115 may be maximum at the bottom of the first lower redistribution via pattern 115, which is in contact with the lower redistribution line pattern 113L and minimum at the top of the first lower redistribution via pattern 115, which is in contact with the first semiconductor chip 120.

FIG. 1 illustrates an example, in which the lower redistribution structure 110 is a redistribution substrate formed using a redistribution process, which will be described with reference to FIGS. 11A to 11G. In some example embodiments, the lower redistribution structure 110 may correspond to a printed circuit board (PCB).

The first semiconductor chip 120 may be on the top surface 119 of the lower redistribution structure 110. The first semiconductor chip 120 may include a first semiconductor substrate 121 and the first chip pad 122. The first semiconductor chip 120 may be mounted on the lower redistribution structure 110 in a face-down manner. The first semiconductor chip 120 may be mounted on the lower redistribution structure 110 such that the bottom surface of the first semiconductor chip 120, which has the first chip pad 122 thereon, is in contact with the top surface 119 of the lower redistribution structure 110. In some embodiments, the first chip pad 122 may be formed at an interface between the topmost lower redistribution insulation layer 111 and a first interconnect structure 129 and may be buried in the topmost lower redistribution insulating layer 111.

The first semiconductor substrate 121 may include a first top surface 121B and a first bottom surface 121F opposite to the first top surface 121B. The first bottom surface 121F of the first semiconductor substrate 121 may correspond to an active surface of the first semiconductor substrate 121, and the first top surface 121B of the first semiconductor substrate 121 may correspond to an inactive surface of the first semiconductor substrate 121. The first bottom surface 121F of the first semiconductor substrate 121 may face the top surface 119 of the lower redistribution structure 110. A first passivation layer 123 covering the first top surface 121B of the first semiconductor substrate 121 may be formed on the first top surface 121B of the first semiconductor substrate 121.

The first semiconductor substrate 121 may be formed of a semiconductor wafer. For example, the first semiconductor substrate 121 may include or may be formed of silicon (Si). In some embodiments, the first semiconductor substrate 121 may include or may be formed of a semiconductor element, e.g., germanium (Ge), or a compound semiconductor such as silicon carbide (SiC), gallium arsenide (GaAs), indium arsenide (InAs), and indium phosphide (InP). The first semiconductor substrate 121 may include a conductive region, such as an impurity-doped well and an impurity-doped structure. The first semiconductor substrate 121 may has various isolation structures including a shallow trench isolation (STI) structure.

The first semiconductor chip 120 may further include a first front-end-of-line (FEOL) structure 128 and a first interconnect structure 129.

The first FEOL structure 128 may be on the first bottom surface 121F of the first semiconductor substrate 121. The first FEOL structure 128 may include a first interlayer insulating layer 1281 and various kinds of individual devices. For example, the first interlayer insulating layer 1281 may include or may be formed of at least one of silicon oxide and silicon nitride. The individual devices may be provided at the active surface of the first semiconductor substrate 121 or the first interlayer insulating layer 1281. For example, the individual devices may include a transistor. For example, the individual devices may include various kinds of microelectronic devices, such as a metal-oxide-semiconductor field effect transistor (MOSFET), a system large-scale integration (LSI) device, an image sensor like a CMOS imaging sensor (CIS), a micro-electro-mechanical system (MEMS), an active element, and a passive element. The individual devices may be electrically connected to the conductive region of the first semiconductor substrate 121. Each of the individual devices may be electrically isolated from other adjacent individual devices by the first interlayer insulating layer 1281.

The first interconnect structure 129 may be on the bottom surface of the first interlayer insulating layer 1281 of the first FEOL structure 128. The first interconnect structure 129 may include a back-end-of-line (BEOL) structure on the bottom surface of the first FEOL structure 128.

The first interconnect structure 129 may include a first conductive interconnect pattern 1291 and a first insulating layer 1295. The first conductive interconnect pattern 1291 of the first interconnect structure 129 may include a plurality of first line patterns 1292 and a plurality of first via patterns 1293. The first line patterns 1292 may be covered with the first insulating layer 1295. The first line patterns 1292 may extend in the horizontal direction (e.g., the X direction and/or the Y direction) in the first insulating layer 1295. The first line patterns 1292 may be at different levels in the vertical direction (e.g., the Z direction) in the first insulating layer 1295, thereby forming a multi-layer interconnect structure (i.e., a multi-level interconnect structure). The first via patterns 1293 may extend between the first line patterns 1292, which are at different vertical levels, and electrically connect the first line patterns 1292, which are at different vertical levels, with each other.

For example, the first line patterns 1292 and the first via patterns 1293 may include or may be formed of metal, such as Cu, Al, W, Ti, Ta, In, Mo, Mn, Co, Sn, Ni, Mg, Re, Be, Ga, Ru, and an alloy thereof.

In example embodiments, the first insulating layer 1295 may include or may be formed of at least one of oxide and nitride. For example, the first insulating layer 1295 may include or may be formed of at least one of silicon oxide and silicon nitride. In example embodiments, the first insulating layer 1295 may include a PID material enabling a photolithography process. In some embodiments, the first insulating layer 1295 may include or may be formed of PSPI.

In embodiments, because the first semiconductor chip 120 is mounted on the lower redistribution structure 110 in the face-down manner, signals (e.g., data signals, control signals, and/or power signals) from an external device may be provided to the first semiconductor chip 120 through a signal transmission path sequentially passing through the external connector 191 and the lower redistribution pattern 113. An output signal of the first semiconductor chip 120 may be provided to an external device through a signal transmission path sequentially passing through the lower redistribution pattern 113 and the external connector 191.

The second semiconductor chip 130 may be on the top surface 119 of the lower redistribution structure 110. The second semiconductor chip 130 may include a second semiconductor substrate 131 and a second chip pad 132. The second semiconductor chip 130 may be mounted on the lower redistribution structure 110 in a face-up manner. The second semiconductor chip 130 may include a top surface having the second chip pad 132 thereon and a bottom surface opposite to the top surface. The second semiconductor chip 130 may be mounted on the lower redistribution structure 110 such that the bottom surface of the second semiconductor chip 130 is in contact with the top surface 119 of the lower redistribution structure 110.

The second semiconductor substrate 131 may include a second top surface 131F and a second bottom surface 131B opposite to the second top surface 131F. The second top surface 131F of the second semiconductor substrate 131 may correspond to an active surface of the second semiconductor substrate 131, and the second bottom surface 131B of the second semiconductor substrate 131 may correspond to an inactive surface of the second semiconductor substrate 131. The second bottom surface 131B of the second semiconductor substrate 131 may face the top surface 119 of the lower redistribution structure 110. A second passivation layer 133 covering the second bottom surface 131B of the second semiconductor substrate 131 may be formed on the second bottom surface 131B of the second semiconductor substrate 131.

The second semiconductor substrate 131 may be formed of a semiconductor wafer. For example, the second semiconductor substrate 131 may include or may be formed of Si. In some embodiments, the second semiconductor substrate 131 may include or may be formed of a semiconductor element, e.g., Ge, or a compound semiconductor such as SiC, GaAs, InAs, and InP. The second semiconductor substrate 131 may include a conductive region, such as an impurity-doped well or an impurity-doped structure. The second semiconductor substrate 131 may has various isolation structures including an STI structure.

The second semiconductor chip 130 may further include a second FEOL structure 138 and a second interconnect structure 139.

The second FEOL structure 138 may be on the second top surface 131F of the second semiconductor substrate 131. The second FEOL structure 138 may include a second interlayer insulating layer 1381 and various kinds of individual devices. For example, the second interlayer insulating layer 1381 may include or may be formed of at least one of silicon oxide and silicon nitride. The individual devices may be provided at the active surface of the second semiconductor substrate 131 or the second interlayer insulating layer 1381. For example, the individual devices may include a transistor. For example, the individual devices may include various kinds of microelectronic devices, such as a MOSFET, an LSI device, an image sensor like a CIS, a MEMS, an active element, and a passive element. The individual devices may be electrically connected to the conductive region of the second semiconductor substrate 131. Each of the individual devices may be electrically isolated from other adjacent individual devices by the second interlayer insulating layer 1381.

The second interconnect structure 139 may be on the second interlayer insulating layer 1381 of the second FEOL structure 138. The second interconnect structure 139 may include a BEOL structure on the second FEOL structure 138.

The second interconnect structure 139 may include a second conductive interconnect pattern 1391 and a second insulating layer 1395. The second conductive interconnect pattern 1391 may include a plurality of second line patterns 1392 and a plurality of second via patterns 1393. The second line patterns 1392 may be covered with the second insulating layer 1395. The second line patterns 1392 may extend in the horizontal direction (e.g., the X direction and/or the Y direction) in the second insulating layer 1395. The second line patterns 1392 may be at different levels in the vertical direction (e.g., the Z direction) in the second insulating layer 1395, thereby forming a multi-layer interconnect structure. The second via patterns 1393 may extend between the second line patterns 1392, which are at different vertical levels, and electrically connect the second line patterns 1392, which are at different vertical levels, with each other.

The material of the second conductive interconnect pattern 1391 may be substantially the same as that of the first conductive interconnect pattern 1291 described above, and the material of the second insulating layer 1395 may be substantially the same as that of the first insulating layer 1295 described above. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In embodiments, because the second semiconductor chip 130 is mounted on the lower redistribution structure 110 in the face-up manner, signals (e.g., data signals, control signals, and/or power signals) from an external device may be provided to the second semiconductor chip 130 through a signal transmission path sequentially passing through the external connector 191, the lower redistribution pattern 113, a conductive connection structure 143 of the connection substrate 140, and an upper redistribution pattern 163. An output signal of the second semiconductor chip 130 may be provided to an external device through a signal transmission path sequentially passing through the upper redistribution pattern 163, the conductive connection structure 143 of the connection substrate 140, the lower redistribution pattern 113, and the external connector 191.

In embodiments, electrical connection between the first semiconductor chip 120 and the second semiconductor chip 130 may be realized through a signal transmission path passing through the lower redistribution pattern 113, the conductive connection structure 143 of the connection substrate 140, and the upper redistribution pattern 163.

In example embodiments, at least one selected from the first semiconductor chip 120 and the second semiconductor chip 130 may correspond to a semiconductor memory chip. For example, the semiconductor memory chip may include a dynamic random access memory (DRAM) chip, a static RAM (SRAM) chip, a flash memory chip, an electrically erasable and programmable read-only memory (EEPROM) chip, a phase-change RAM (PRAM) chip, a magnetic RAM (MRAM) chip, or a resistive RAM (RRAM) chip.

In example embodiments, at least one selected from the first semiconductor chip 120 and the second semiconductor chip 130 may correspond to a semiconductor logic chip. For example, the semiconductor logic chip may include a central processing unit (CPU) chip, a graphics processing unit (GPU) chip, or an application processor (AP) chip. The semiconductor logic chip may refer to a semiconductor chip that is not a semiconductor memory chip and performs a logical operation. For example, the semiconductor logic chip may include a logic cell. The logic cell may be variously configured using a plurality of circuit elements such as a transistor and a register. For example, the logic cell may constitute an AND gate, a NAND gate, an OR gate, a NOR gate, an exclusive OR (XOR) gate, an exclusive NOR (XNOR) gate, an inverter (INV), an adder (ADD), a buffer (BUF), a delay (DLY), a filter (FIL), a multiplexer (MXT/MXIT), an OR/AND/inverter (OAI) gate, an AND/OR (AO) gate, an AND/OR/inverter (AOI) gate, a D flip-flop, a reset flip-flop, a master-slaver flip-flop, or a latch. The logic cell may constitute a standard cell, such as a counter or a buffer, which performs a desired logical function.

The connection substrate 140 may be on the top surface 119 of the lower redistribution structure 110 and include an accommodation space 149H (in FIG. 11A) that may accommodate the first semiconductor chip 120 and the second semiconductor chip 130. The accommodation space 149H may include a cavity provided in a central portion of the connection substrate 140 and may be defined by a substrate base 141 of the connection substrate 140. An inner wall 149 of the connection substrate 140 may surround a side wall of the first semiconductor chip 120 and a side wall of the second semiconductor chip 130. The inner wall of the connection substrate 140 defines the accommodation space 149H. The connection substrate 140 may have a vertical height that is similar to or substantially the same as the vertical height of the first semiconductor chip 120 and/or the vertical height of the second semiconductor chip 130.

In example embodiments, the connection substrate 140 may include a panel board. For example, the connection substrate 140 may include a PCB, a ceramic board, or a wafer. In example embodiments, the connection substrate 140 may include a multi-layer PCB.

The connection substrate 140 may include the substrate base 141 and the conductive connection structure 143, which extends through the substrate base 141.

The substrate base 141 may include or may be formed of at least one material selected from phenol resin, epoxy resin, and polyimide. For example, the substrate base 141 may include or may be formed of at least one material selected from frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

The conductive connection structure 143 may electrically connect the lower redistribution pattern 113 of the lower redistribution structure 110 to the upper redistribution pattern 163 of the upper redistribution structure 160. The conductive connection structure 143 may include a plurality of interconnect patterns 143L extending in the horizontal direction (e.g., the X direction and/or the Y direction) and a plurality of conductive via patterns 143V extending in the vertical direction (e.g., the Z direction). The conductive connection structure 143 may include or may be formed of a conductive material such as Cu, Ni, stainless steel, and beryllium copper.

In example embodiments, the connection substrate 140 may correspond to a multi-layer substrate, in which the substrate base 141 includes a plurality of layers. The interconnect patterns 143L may be at different vertical levels to be separate from each other in the substrate base 141. A plurality of interconnect patterns 143L may extend on at least one selected from the top and bottom surfaces of each of the multiple layers of the substrate base 141. The conductive via patterns 143V may extend in the vertical direction (e.g., the Z direction) passing through at least a portion of the substrate base 141 and electrically connect the interconnect patterns 143L, which are at different vertical levels, with each other.

The molding layer 150 may be on the lower redistribution structure 110 and cover at least a portion of the first semiconductor chip 120, at least a portion of the second semiconductor chip 130, and at least a portion of the connection substrate 140. For example, the molding layer 150 may cover the side wall and top surface of the first semiconductor chip 120, the side wall and top surface of the second semiconductor chip 130, and the inner wall 149 and top surface of the connection substrate 140. The molding layer 150 may fill the accommodation space 149H of the connection substrate 140. For example, the molding layer 150 may fill a space between the side wall of the first semiconductor chip 120 and the inner wall 149 of the connection substrate 140, a space between the side wall of the first semiconductor chip 120 and the side wall of the second semiconductor chip 130, and a space between the side wall of the second semiconductor chip 130 and the inner wall 149 of the connection substrate 140.

As shown in FIG. 1, the molding layer 150 may not cover an outer wall (e.g., an outer sidewall) of the connection substrate 140. In example embodiments, the outer wall of the connection substrate 140 may be coplanar with an outer wall (e.g., an outer sidewall) of the molding layer 150. In example embodiments, the molding layer 150 may cover the outer wall of the connection substrate 140.

The molding layer 150 may include or may be formed of thermosetting resin such as epoxy resin, thermoplastic resin like polyimide, and thermosetting. In some embodiments, the thermoplastic resin may include a stiffener such as an inorganic filler. In example embodiments, the molding layer 150 may include or may be formed of an epoxy mold compound (EMC). In example embodiments, the molding layer 150 may include or may be formed of a photosensitive material such as photoimagable encapsulant (PIE).

The upper redistribution structure 160 may include an upper redistribution insulating layer 161 and the upper redistribution pattern 163.

The upper redistribution insulating layer 161 may be on a top surface 159 of the molding layer 150. The upper redistribution insulating layer 161 may cover the top surface 159 of the molding layer 150. The upper redistribution insulating layer 161 may be formed of a material film including an organic compound. For example, the upper redistribution insulating layer 161 may be formed of PID, ABF, or PSPI. For example, the vertical height of the upper redistribution insulating layer 161 may be about 50 µm to about 90 µm.

The upper redistribution pattern 163 may include a plurality of upper redistribution line patterns 163L and a plurality of upper redistribution via patterns 163V. The upper redistribution line patterns 163L may extend along the top surface 159 of the molding layer 150. The upper redistribution via patterns 163V may extend downwards from the top surface 159 of the molding layer 150 and pass through the molding layer 150.

At least some of the upper redistribution line patterns 163L may be respectively integrally formed together with some of the upper redistribution via patterns 163V, which will be descried with reference to FIGS. 11A to 11G. For example, some of the upper redistribution line patterns 163L may be respectively integrally formed together with some of the upper redistribution via patterns 163V which are respectively in contact with the respective bottom surfaces of some of the upper redistribution line patterns 163L. For example, the upper redistribution line patterns 163L and the upper redistribution via patterns 163V may be formed together using an electroplating process. In the electroplating process, a seed metal layer may be between the molding layer 150 and each of the upper redistribution line patterns 163L and the upper redistribution via patterns 163V. For example, the seed metal layer may include or may be formed of at least one selected from Cu, Ti, TiW, TiN, Ta, TaN, Cr, and Al. In some embodiments, the seed metal layer may be formed using physical vapor deposition such as sputtering.

For example, the upper redistribution pattern 163 may include or may be formed of metal, such as Cu, Al, W, Ti, Ta, In, Mo, Mn, Co, Sn, Ni, Mg, Re, Be, Ga, Ru, and an alloy thereof.

The upper redistribution via patterns 163V may include a first upper redistribution via pattern 165, which electrically connects a corresponding one of the upper redistribution line patterns 163L to the second chip pad 132 of the second semiconductor chip 130, and a second upper redistribution via pattern 166, which electrically connects a corresponding one of the upper redistribution line patterns 163L to the conductive connection structure 143 of the connection substrate 140.

The first upper redistribution via pattern 165 may extend through a first via hole 151H (in FIG. 11D) of the molding layer 150 and between each of some of the upper redistribution line patterns 163L and the second chip pad 132 of the second semiconductor chip 130. The first upper redistribution via pattern 165 may extend downwards from the top surface 159 of the molding layer 150, and thus may be connected to the second chip pad 132 of the second semiconductor chip 130.

The second upper redistribution via pattern 166 may extend through a second via hole 152H (in FIG. 11D) of the molding layer 150 and between each of some of the upper redistribution line patterns 163L and the conductive connection structure 143 of the connection substrate 140. The second upper redistribution via pattern 166 may extend downwards from the top surface 159 of the molding layer 150, and thus may be connected to the conductive connection structure 143 of the connection substrate 140.

In example embodiments, each of the upper redistribution via patterns 163V may have a tapered shape having a horizontal width decreasing from the top of each upper redistribution via pattern 163V to the bottom thereof.

For example, the first upper redistribution via pattern 165 may have a tapered shape having a horizontal width decreasing toward the second chip pad 132 of the second semiconductor chip 130. A first side wall 151 of the molding layer 150 may be in contact with the first upper redistribution via pattern 165, extend slanted to the vertical direction (e.g., the Z direction), and define the first via hole 151H having a shape having a horizontal width decreasing toward the second chip pad 132 of the second semiconductor chip 130. A horizontal width 165W of the first upper redistribution via pattern 165 may be maximum at the top surface of the first upper redistribution via pattern 165, which is coplanar with the top surface 159 of the molding layer 150, and minimum at the bottom surface of the first upper redistribution via pattern 165, which is in contact with the second chip pad 132 of the second semiconductor chip 130.

For example, the second upper redistribution via pattern 166 may have a tapered shape having a horizontal width decreasing toward the top surface of the connection substrate 140. A second side wall 152 of the molding layer 150 may be in contact with the second upper redistribution via pattern 166, extend slanted to the vertical direction (e.g., the Z direction), and define the second via hole 152H having a shape having a horizontal width decreasing toward the top surface of the connection substrate 140. The horizontal width of the second upper redistribution via pattern 166 may be maximum at the top surface of the second upper redistribution via pattern 166, which is coplanar with the top surface 159 of the molding layer 150, and minimum at the bottom surface of the second upper redistribution via pattern 166, which is in contact with the conductive connection structure 143 of the connection substrate 140.

As shown in FIG. 3, a first upper seed metal layer 168 may be between the first upper redistribution via pattern 165 and the first side wall 151 of the molding layer 150, between the first upper redistribution via pattern 165 and the second chip pad 132 of the second semiconductor chip 130, and between an upper redistribution line pattern 163L and the top surface 159 of the molding layer 150. Although not shown, an upper seed metal layer may be between the second upper redistribution via pattern 166 and the second side wall of the molding layer 150, between the second upper redistribution via pattern 166 and the conductive connection structure 143 of the connection substrate 140, and between an upper redistribution line pattern 163L contacting the second upper redistribution via pattern 166 and the top surface 159 of the molding layer 150.

In example embodiments, a horizontal width 132W of the second chip pad 132 of the second semiconductor chip 130 may be greater than a horizontal width 122W of the first chip pad 122 of the first semiconductor chip 120. In example embodiments, the horizontal width 132W of the second chip pad 132 of the second semiconductor chip 130 may be about 150% to about 300% or about 200% to about 250% of the horizontal width 122W of the first chip pad 122 of the first semiconductor chip 120. For example, the horizontal width 132W of the second chip pad 132 of the second semiconductor chip 130 may be between about 75 μm and about 140 μm. For example, the horizontal width 122W of the first chip pad 122 of the first semiconductor chip 120 may be between about 30 μm and about 70 μm.

In example embodiments, the horizontal width 165W of the first upper redistribution via pattern 165 may be greater than the horizontal width 115W of the first lower redistribution via pattern 115. In example embodiments, the horizontal width 165W of the first upper redistribution via pattern 165 may be about 150% to about 300% or about 200% to about 250% of the horizontal width 115W of the first lower redistribution via pattern 115. For example, the horizontal width 165W of the first upper redistribution via pattern 165 may be between about 30 μm and about 60 μm. For example, the horizontal width 115W of the first lower redistribution via pattern 115 may be between about 10 μm and about 30 μm. In some embodiments, a first signal path between the first semiconductor chip 120 and the lower redistribution structure 110 may be shorter than a second signal path between the second semiconductor chip 130 and the lower redistribution structure 110. The first semiconductor chip 120 may be mounted on the lower redistribution structure 110 in a face-down manner and may be directly connected to the lower redistribution structure 110. Such direct connection between the first semiconductor chip 120 and the lower redistribution structure 110 may be referred to as the first signal path. The second semiconductor chip 130 may be mounted on the lower redistribution structure 110 in a face-up manner and may be connected to the lower redistribution structure 110 via the upper redistribution structure 160 and the conductive connection structure 143. Such indirect connection between the second semiconductor chip 130 and the lower redistribution structure 110 via the upper redistribution structure 160 and the conductive connection structure 143 may be referred to as the second signal path. To reduce a signal delay such resistive-capacitive (RC) delay in the second signal path, a contact area (such as a contact area between the second upper redistribution via pattern 166 and the interconnect pattern 143L or a contact area between the first upper redistribution via pattern 165 and the second chip pad 132) in the second signal path may be greater than a contact area (such as the first lower redistribution via pattern 115 and the first chip pad 122) formed in the first signal path. In some embodiments, via patterns in the second signal path may be greater than via patterns in the first signal path in size (e.g., a width or an area). In some embodiments, chip pads in the second signal path may be greater than chip pads in the first signal path in size (e.g., a width or an area).

When the horizontal width 132W of the second chip pad 132 of the second semiconductor chip 130 and the horizontal width 165W of the first upper redistribution via pattern 165 are relatively great, the contact area between the second chip pad 132 of the second semiconductor chip 130 and the first upper redistribution via pattern 165 may increase, and accordingly, the electrical characteristics of the second chip pad 132 of the second semiconductor chip 130 and the first upper redistribution via pattern 165 may be improved. As a result, electrical signal characteristics via the second semiconductor chip 130 may be improved.

Figure 4:
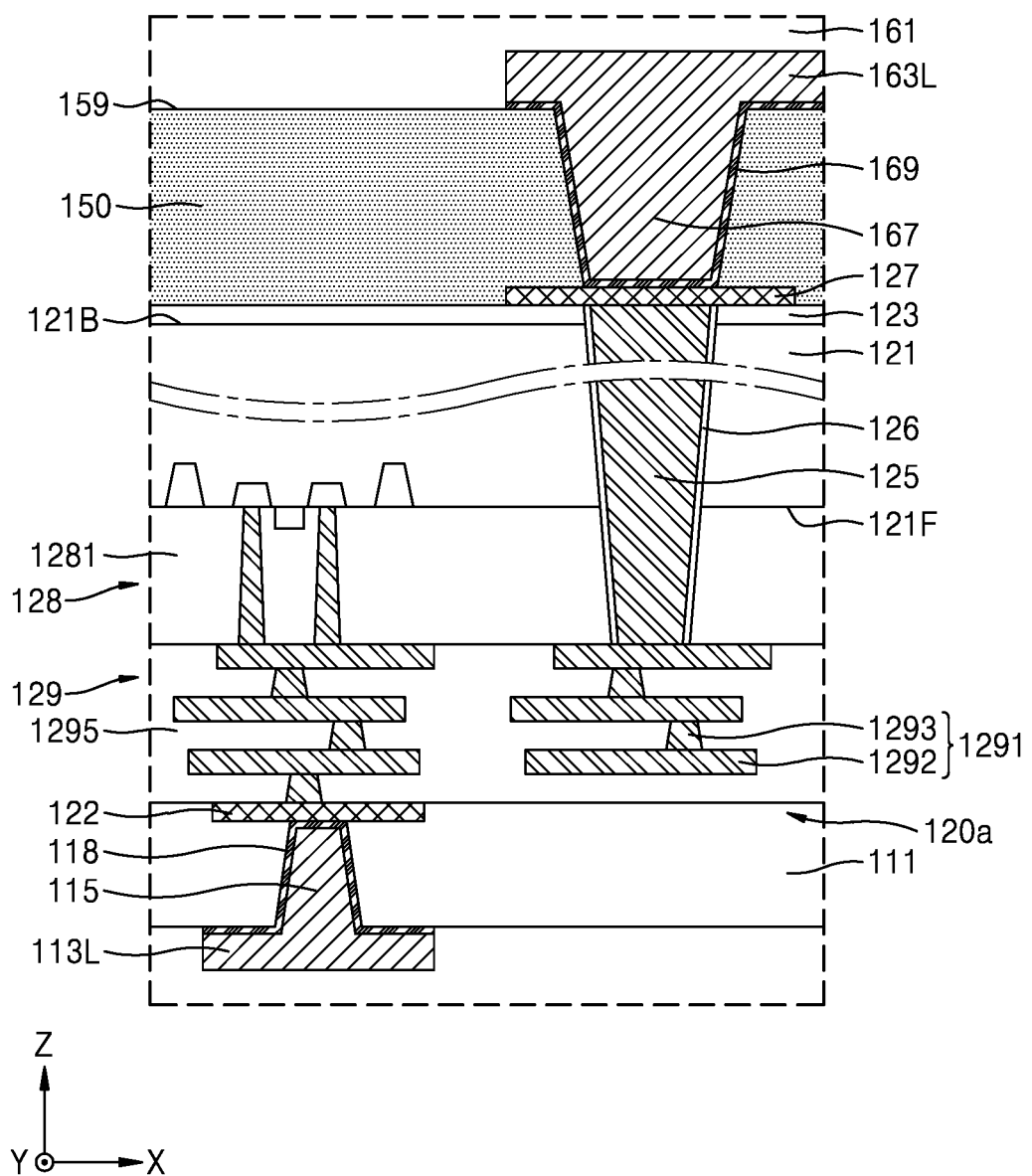
FIG. 4 is a cross-sectional view of a portion of a semiconductor package according to example embodiments.

FIG. 4 is a cross-sectional view of a portion of a semiconductor package according to example embodiments. The semiconductor package of FIG. 4 will be described focusing on differences from the semiconductor package 1000 described above with reference to FIGS. 1 through 3.

Referring to FIGS. 1 and 4, a first semiconductor chip 120a may include a first through electrode 125, which extends through the first semiconductor substrate 121, and a first electrode pad 127, which is above the first top surface 121B of the first semiconductor substrate 121 and connected to the first through electrode 125.

The first through electrode 125 may pass through the first passivation layer 123, the first semiconductor substrate 121, and the first FEOL structure 128, and may be electrically connected to the first conductive interconnect pattern 1291 of the first interconnect structure 129. The first electrode pad 127 may be on the first passivation layer 123 and connected to the top surface of the first through electrode 125. The first through electrode 125 may have a pillar shape. In example embodiments, the first through electrode 125 may have a tapered shape having a horizontal width decreasing from the first top surface 121B of the first semiconductor substrate 121 toward the first bottom surface 121F of the first semiconductor substrate 121. For example, the first through electrode 125 may include or may be formed of at least one material selected from Cu, Al, W, Ti, Ta, In, Mo, Mn, Co, Sn, Ni, Mg, Re, Be, Ga, and Ru. A first via insulating layer 126 may be between the first through electrode 125 and the first semiconductor substrate 121. For example, the first via insulating layer 126 may include or may be formed of an oxide film.

The upper redistribution pattern 163 may further include a third upper redistribution via pattern 167, which electrically connects the upper redistribution line pattern 163L to the first through electrode 125. The third upper redistribution via pattern 167 may extend through a via hole of the molding layer 150 and extend between the upper redistribution line pattern 163L and the first electrode pad 127. The third upper redistribution via pattern 167 may extend downwards from the top surface 159 of the molding layer 150, and thus may be connected to the first electrode pad 127. In example embodiments, a seed metal layer 169 may be between the third upper redistribution via pattern 167 and a side wall of the molding layer 150, between the third upper redistribution via pattern 167 and the first electrode pad 127, and between the top surface 159 of the molding layer 150 and the upper redistribution line pattern 163L connected to the third upper redistribution via pattern 167. The third upper redistribution via pattern 167 may be formed together with the first upper redistribution via pattern 165 using the same metal interconnect process, which will be described with reference to FIGS. 11A to 11G.

In example embodiments, the third upper redistribution via pattern 167 may have a tapered shape having a horizontal width decreasing toward the first electrode pad 127. The horizontal width of the third upper redistribution via pattern 167 may be maximum at the top surface of the third upper redistribution via pattern 167, which is coplanar with the top surface 159 of the molding layer 150, and minimum at the bottom surface of the third upper redistribution via pattern 167, which is in contact with the first electrode pad 127.

In example embodiments, the first through electrode 125 of the first semiconductor chip 120a and the third upper redistribution via pattern 167 may form a signal transmission path between the first semiconductor chip 120a and the second semiconductor chip 130 and/or a signal transmission path between the first semiconductor chip 120a and a third semiconductor chip 330 (in FIG. 10) on the upper redistribution structure 160.

Figure 5:
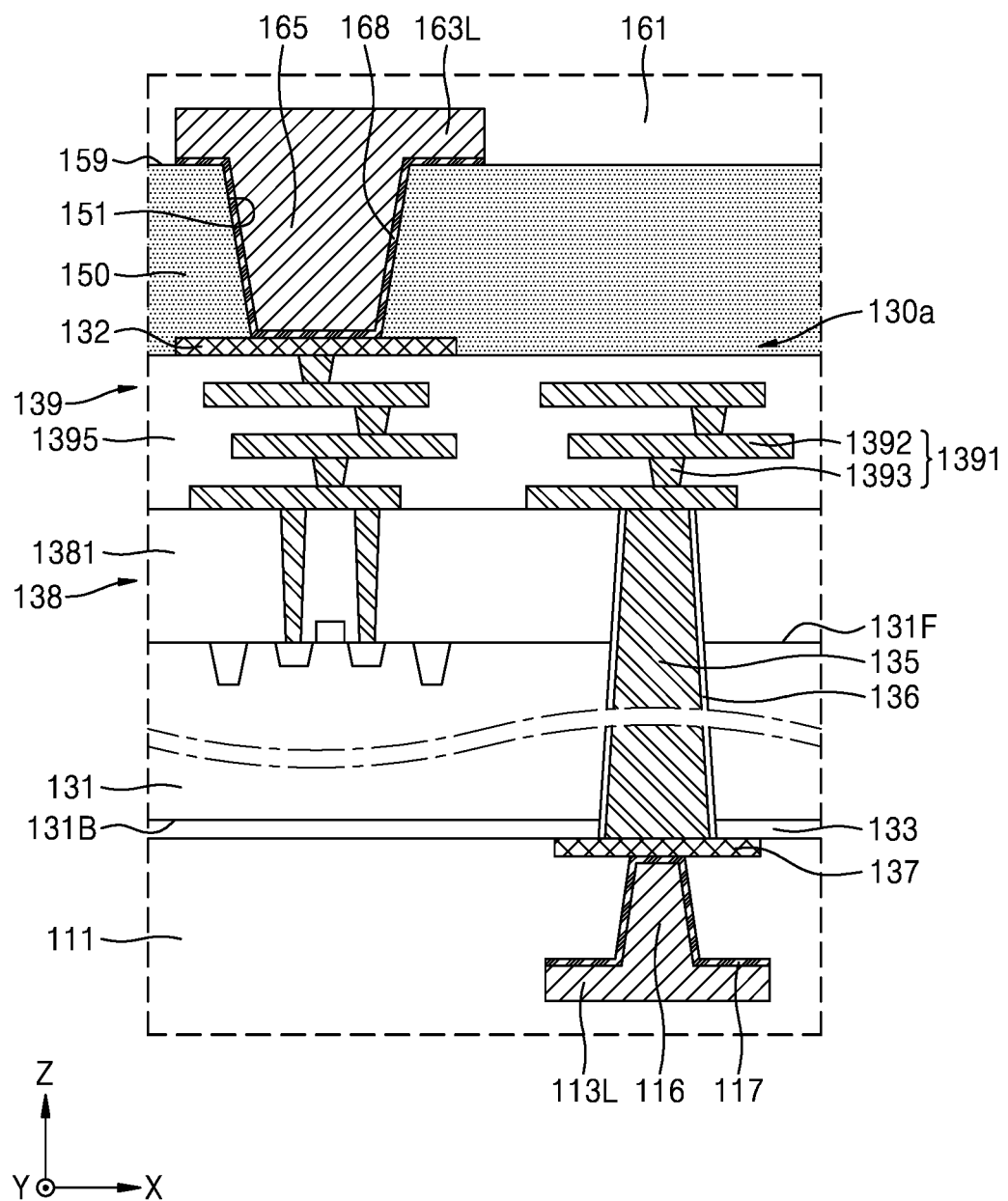
FIG. 5 is a cross-sectional view of a portion of a semiconductor package according to example embodiments.

FIG. 5 is a cross-sectional view of a portion of a semiconductor package according to example embodiments. The semiconductor package of FIG. 5 will be described focusing on differences from the semiconductor package 1000 described above with reference to FIGS. 1 through 3.

Referring to FIGS. 1 and 5, a second semiconductor chip 130a may include a second through electrode 135, which extends through the second semiconductor substrate 131, and a second electrode pad 137, which is below the second bottom surface 131B of the second semiconductor substrate 131 and connected to the second through electrode 135.

The second through electrode 135 may pass through the second passivation layer 133, the second semiconductor substrate 131, and the second FEOL structure 138, and may be electrically connected to the second conductive interconnect pattern 139I of the second interconnect structure 139. The second electrode pad 137 may be on the second passivation layer 133 and connected to the bottom surface of the second through electrode 135. The second through electrode 135 may have a pillar shape. In example embodiments, the second through electrode 135 may have a tapered shape having a horizontal width decreasing from the second bottom surface 131B of the second semiconductor substrate 131 toward the second top surface 131F of the second semiconductor substrate 131. A second via insulating layer 136 may be between the second through electrode 135 and the second semiconductor substrate 131. The material of the second through electrode 135 may be the same as that of the first through electrode 125 described above with reference to FIG. 4, and the material of the second via insulating layer 136 may be the same as that of the first via insulating layer 126 described above with reference to FIG. 4.

The lower redistribution pattern 113 may further include a second lower redistribution via pattern 116, which electrically connects the lower redistribution line pattern 113L to the second through electrode 135. The second lower redistribution via pattern 116 may pass through the topmost lower redistribution insulating layer 111, and thus may be connected to the bottom surface of the second electrode pad 137. In example embodiments, a seed metal layer 117 may be between the second lower redistribution via pattern 116 and a side wall of the topmost lower redistribution insulating layer 111, between the second lower redistribution via pattern 116 and the second electrode pad 137, and between the bottom surface of the topmost lower redistribution insulating layer 111 and the lower redistribution line pattern 113L connected to the second lower redistribution via pattern 116.

In example embodiments, the second lower redistribution via pattern 116 may have a tapered shape having a horizontal width decreasing toward the second electrode pad 137. The horizontal width of the second lower redistribution via pattern 116 may be maximum at the bottom surface of the second lower redistribution via pattern 116, which is connected to the lower redistribution line pattern 113L, and minimum at the top surface of the second lower redistribution via pattern 116, which is in contact with the second electrode pad 137.

In example embodiments, the second through electrode 135 of the second semiconductor chip 130a and the second lower redistribution via pattern 116 may form a signal transmission path between the first semiconductor chip 120 and the second semiconductor chip 130a and/or a signal transmission path between the second semiconductor chip 130a and the third semiconductor chip 330 (in FIG. 10) on the upper redistribution structure 160.

Figure 6:
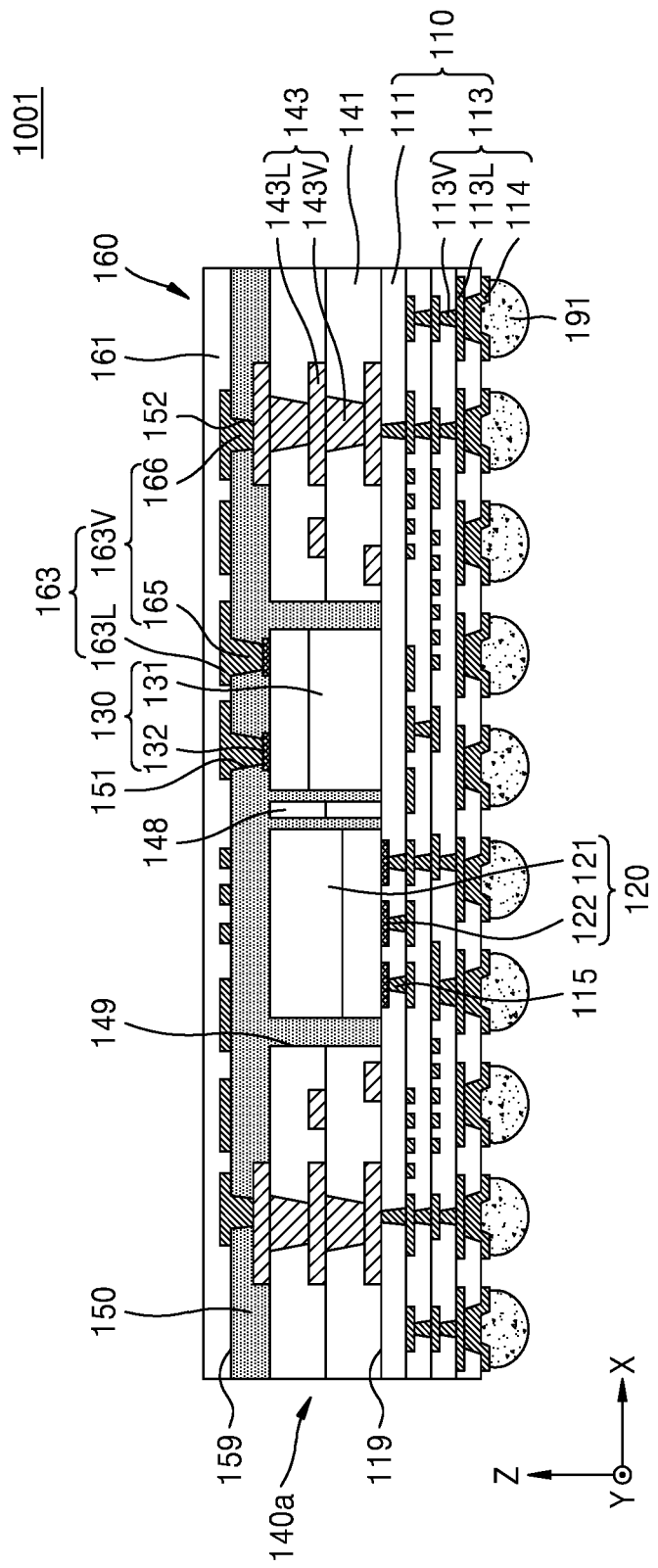
FIG. 6 is a cross-sectional view of a semiconductor package according to example embodiments.

FIG. 6 is a cross-sectional view of a semiconductor package 1001 according to example embodiments. The semiconductor package 1001 of FIG. 6 will be described focusing on differences from the semiconductor package 1000 described above with reference to FIGS. 1 through 3.

Referring to FIG. 6, a connection substrate 140a may include an isolation wall 148 between the first semiconductor chip 120 and the second semiconductor chip 130. The isolation wall 148 may be a portion of the substrate base 141. The isolation wall 148 may include or may be formed of the same material as the substrate base 141. As viewed from above, the accommodation space 149H (see FIG. 11A) of the connection substrate 140a may be divided into a plurality of spaces by the isolation wall 148. For example, the isolation wall 148 may divide the accommodation space 149H of the connection substrate 140a into a first accommodation space that accommodates the first semiconductor chip 120 therein and a second accommodation space that accommodates the second semiconductor chip 130 therein.

Figure 7:
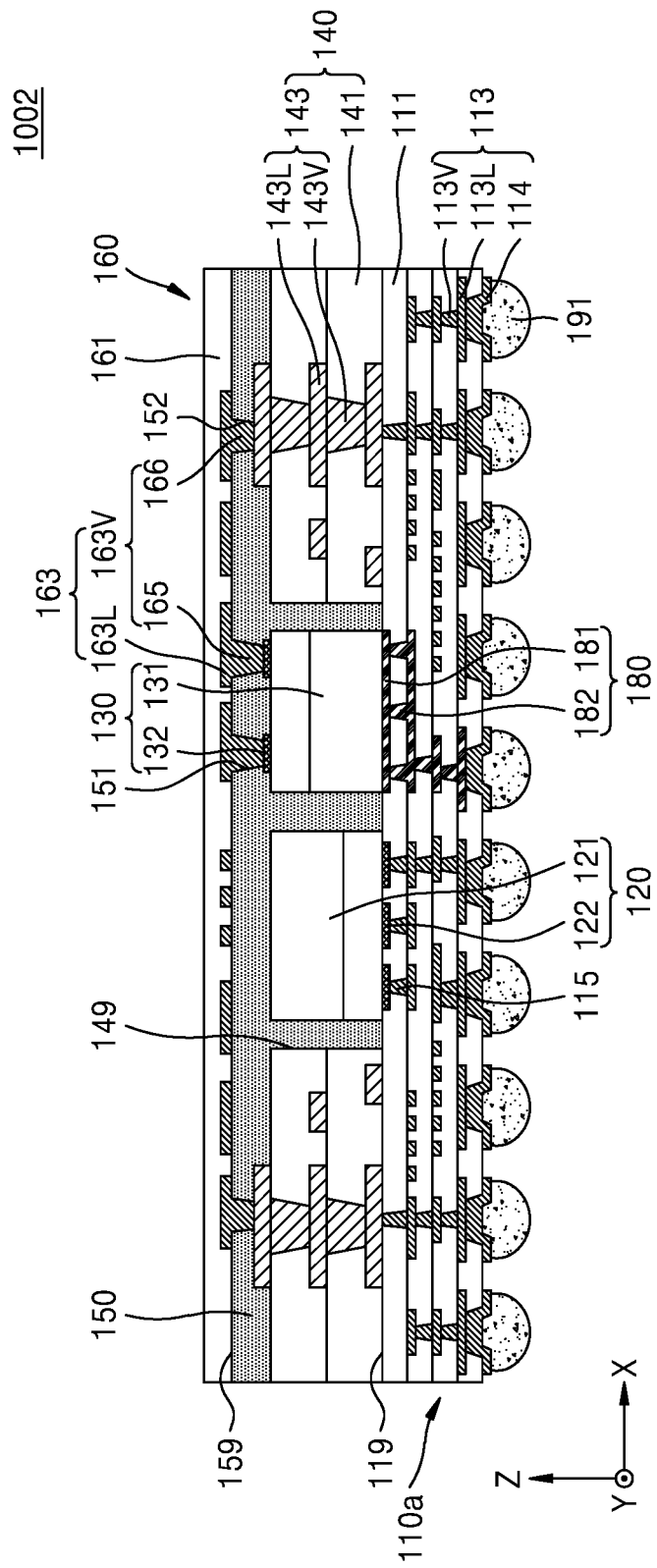
FIG. 7 is a cross-sectional view of a semiconductor package according to example embodiments.

FIG. 7 is a cross-sectional view of a semiconductor package 1002 according to example embodiments. The semiconductor package 1002 of FIG. 7 will be described focusing on differences from the semiconductor package 1000 described above with reference to FIGS. 1 through 3.

Referring to FIG. 7, a lower redistribution structure 110a may include a conductive heat dissipation structure 180, which includes a plurality of heat dissipation conductive layers 181 and a plurality of heat dissipation vias 182.

The heat dissipation conductive layers 181 may be at different vertical levels from each other, thereby forming a multi-layer structure. The heat dissipation vias 182 may connect the heat dissipation conductive layers 181, which are at different vertical levels, with each other. The heat dissipation conductive layers 181 and the heat dissipation vias 182 may be formed using the same metal interconnect process as the lower redistribution pattern 113. For example, the heat dissipation conductive layers 181 and the heat dissipation vias 182, and the lower redistribution pattern 113 may be formed using the same metal interconnect process, which will be described with reference to FIGS. 11A to 11G. The heat dissipation conductive layers 181 may include the same material as the lower redistribution line pattern 113L or may have the same material composition as the lower redistribution line pattern 113L. The heat dissipation vias 182 may include or may be formed of the same material as the lower redistribution via patterns 113V or have the same material composition as the lower redistribution via patterns 113V.

A topmost heat dissipation conductive layer 181 among the heat dissipation conductive layers 181 may be in contact with the bottom surface of the second semiconductor chip 130. The conductive heat dissipation structure 180 may be thermally coupled to at least one of a plurality of external connection pads 114 and at least one of a plurality of external connectors 191. The heat dissipation conductive layers 181 and the heat dissipation vias 182 may form a heat dissipation path for emitting heat generated by the second semiconductor chip 130 to the outside.

Figure 8:
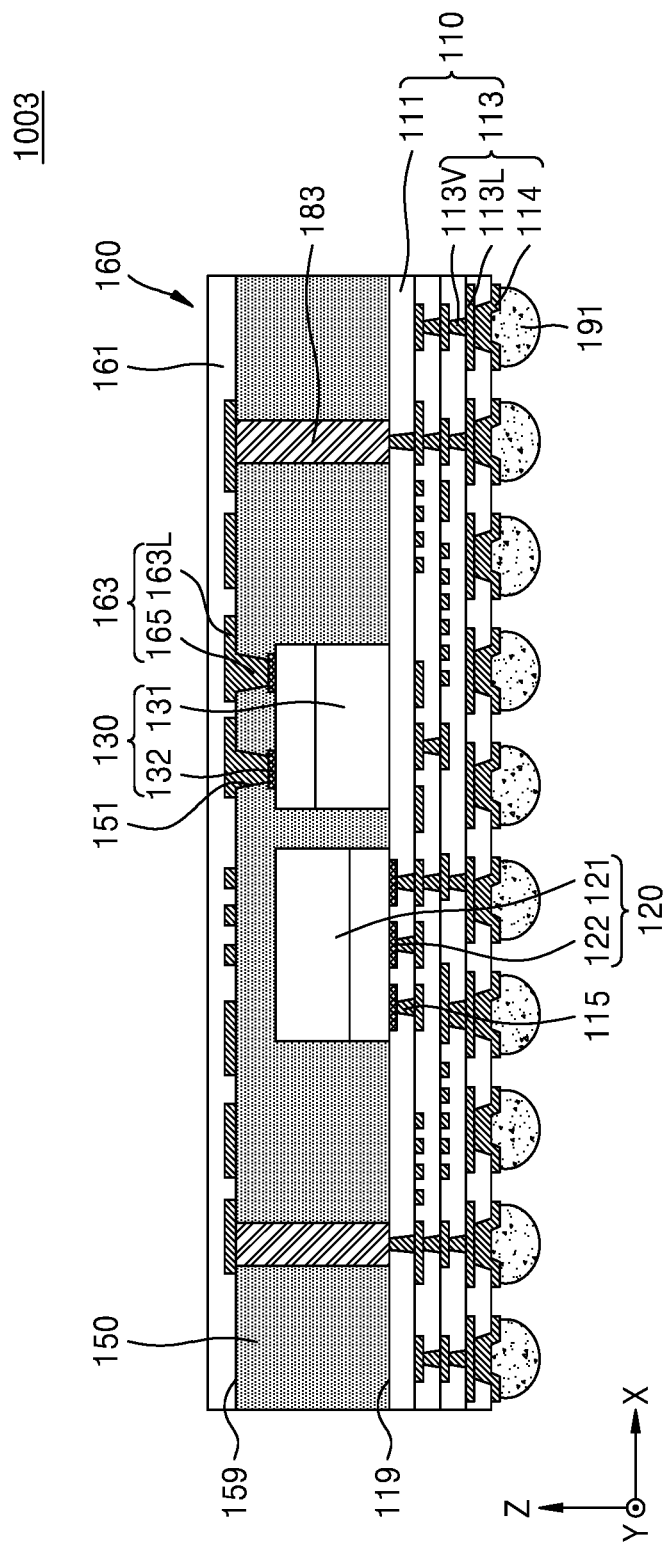
FIG. 8 is a cross-sectional view of a semiconductor package according to example embodiments.

FIG. 8 is a cross-sectional view of a semiconductor package 1003 according to example embodiments. The semiconductor package 1003 of FIG. 8 will be described focusing on differences from the semiconductor package 1000 described above with reference to FIGS. 1 through 3.

Referring to FIG. 8, a conductive connection structure 183, which electrically connects the lower redistribution pattern 113 of the lower redistribution structure 110 to the upper redistribution pattern 163 of the upper redistribution structure 160, may be provided in the molding layer 150. The conductive connection structure 183 may include a conductive post having a pillar shape extending and passing through the molding layer 150 in the vertical direction (e.g., the Z direction). The bottom surface of the conductive connection structure 183 may be in contact with the top surface 119 of the lower redistribution structure 110, and the top surface of the conductive connection structure 183 may be coplanar with the top surface 159 of the molding layer 150. The top surface of the conductive connection structure 183 may be directly connected to the upper redistribution line pattern 163L extending along the top surface 159 of the molding layer 150.

For example, the semiconductor package 1003 of FIG. 8 may be formed using chip-first fan-out semiconductor package manufacturing processes. For example, to manufacture the semiconductor package 1003 of FIG. 8 using chip-first fan-out semiconductor package manufacturing processes, an operation of positioning the first semiconductor chip 120 and the second semiconductor chip 130 on a carrier substrate, an operation of forming the conductive connection structure 183 and the molding layer 150, and an operation of forming the upper redistribution structure 160, and an operation of forming the lower redistribution structure 110 on a surface exposed by removing the carrier substrate may be sequentially performed. In the chip-first fan-out semiconductor package manufacturing process, the first semiconductor chip 120 and second semiconductor chip 130 may be mounted on a carrier substrate before forming the lower redistribution structure 110.

Figure 9:
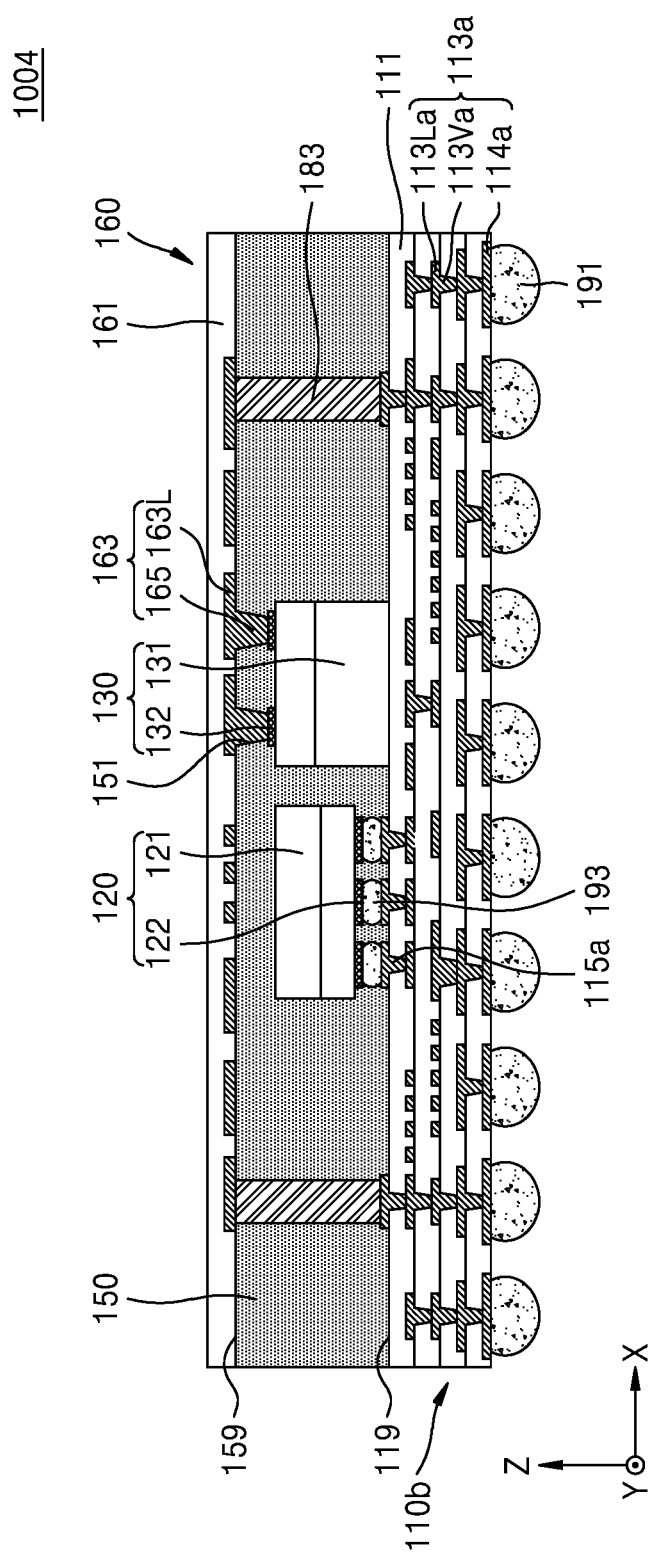
FIG. 9 is a cross-sectional view of a semiconductor package according to example embodiments.

FIG. 9 is a cross-sectional view of a semiconductor package 1004 according to example embodiments. The semiconductor package 1004 of FIG. 9 will be described focusing on differences from the semiconductor package 1003 described above with reference to FIG. 8.

Referring to FIG. 9, the lower redistribution structure 110b may include a plurality of lower redistribution insulating layers 111 and a lower redistribution pattern 113a. The lower redistribution pattern 113a may include a plurality of lower redistribution line patterns 113La, which extend along least one selected from the top and bottom surfaces of each of the lower redistribution insulating layers 111, a plurality of lower redistribution via patterns 113Va, which extend through at least one of the lower redistribution insulating layers 111, and an external connection pad 114a to which an external connector 191 is attached. The external connection pad 114a may have substantially a uniform thickness. The bottom surface of the external connection pad 114a, to which the external connector 191 is attached, and the top surface of the external connection pad 114a, which is connected to a lower redistribution via pattern 113Va, may be flat.

Each of the lower redistribution via patterns 113Va may have a tapered shape having a horizontal width decreasing from the top thereof toward the bottom thereof. In other words, the horizontal width of each of the lower redistribution via patterns 113Va may gradually decrease away from the top surface 119 of the lower redistribution structure 110a or the first chip pad 122 of the first semiconductor chip 120. A first lower redistribution via pattern 115a, which passes through the topmost lower redistribution insulating layer 111 and is electrically connected to the first chip pad 122, may also have a tapered shape having a horizontal width decreasing away from the top surface 119 of the lower redistribution structure 110a or the first chip pad 122 of the first semiconductor chip 120.

The first semiconductor chip 120 may be mounted on the lower redistribution structure 110b in a flip chip manner through a chip connection bump 193. The chip connection bump 193 may be between the first chip pad 122 of the first semiconductor chip 120 and a portion of the lower redistribution pattern 113a. The portion of the lower redistribution pattern 113a is on the topmost lower redistribution insulating layer 111.

For example, the semiconductor package 1004 of FIG. 9 may be formed using chip-last fan-out semiconductor package manufacturing processes. For example, to manufacture the semiconductor package 1004 of FIG. 9 using chip-last fan-out semiconductor package manufacturing processes, an operation of forming the lower redistribution structure 110b, an operation of mounting the first semiconductor chip 120 and the second semiconductor chip 130 on the lower redistribution structure 110b, an operation of forming the conductive connection structure 183 and the molding layer 150, and an operation of forming the upper redistribution structure 160 may be sequentially performed. For example, in the chip-last fan-out semiconductor package manufacturing process, the lower redistribution structure 110b may be formed before the mounting of the first semiconductor chip 120 and the second semiconductor chip 130 on the lower redistribution structure 110b.

Figure 10:
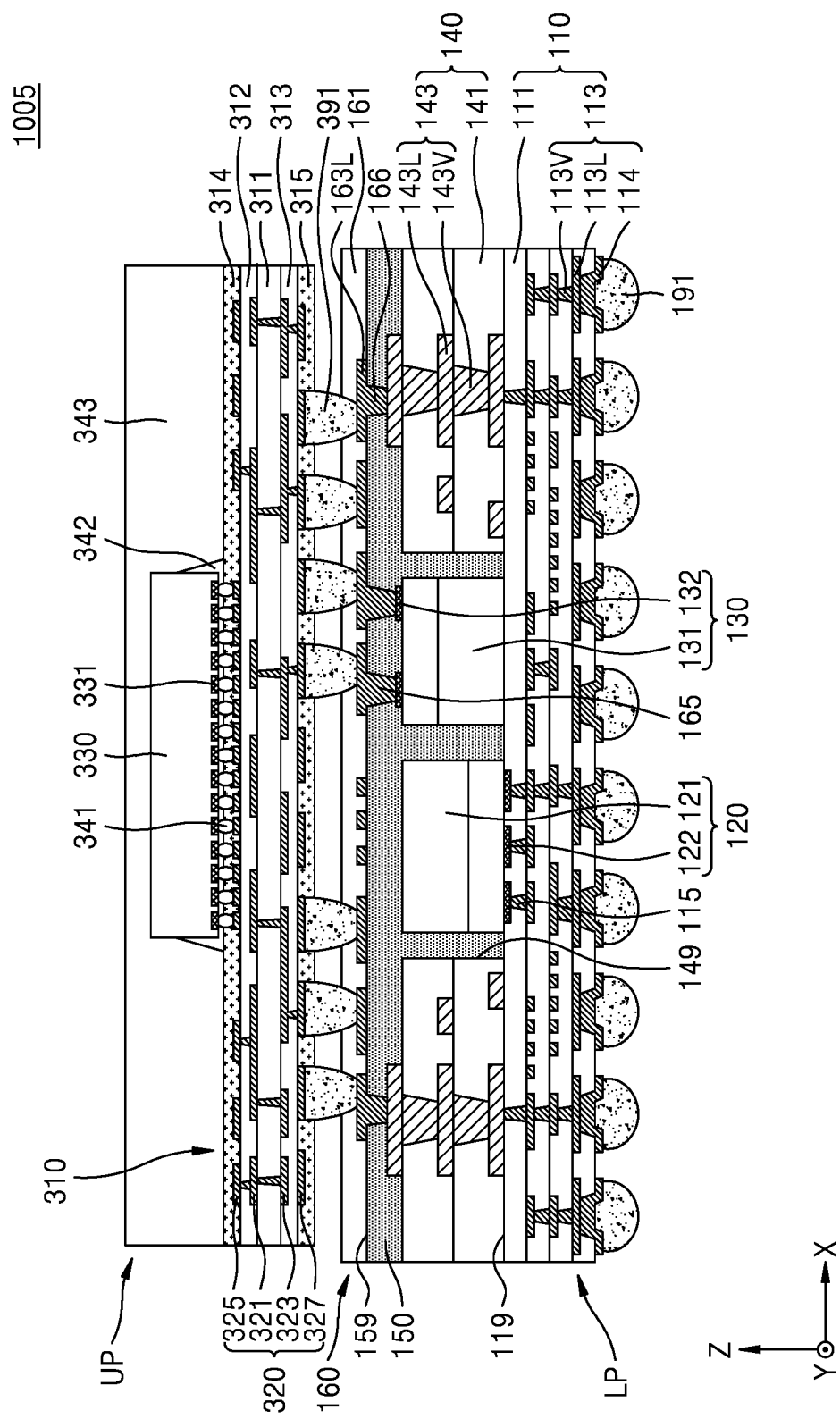
FIG. 10 is a cross-sectional view of a semiconductor package according to example embodiments.

FIG. 10 is a cross-sectional view of a semiconductor package 1005 according to example embodiments.

Referring to FIGS. 1 and 10, the semiconductor package 1005 may include a lower package LP and an upper package UP. The semiconductor package 1005 may correspond to a package-on-package-type semiconductor package in which the upper package UP is stacked on the lower package LP of a fan-out semiconductor package type.

Although it is illustrated in FIG. 10 that the lower package LP corresponds to the semiconductor package 1000 described with reference to FIG. 1, the lower package LP may include one of the semiconductor packages described with reference to FIGS. 4 and 5 or one of the semiconductor packages 1001, 1002, 1003, and 1004 described with reference to FIGS. 6 through 9.

The upper package UP may include a package substrate 310, the third semiconductor chip 330, and an upper molding layer 343.

For example, the package substrate 310 may include a PCB. The package substrate 310 may include a base layer 311, an upper insulating layer 312 on the top surface of the base layer 311, a lower insulating layer 313 on the bottom surface of the base layer 311, an upper protection layer 314 on the top surface of the upper insulating layer 312, and a lower protection layer 315 on the bottom surface of the lower insulating layer 313. The package substrate 310 may also include a conductive interconnect structure 320, which includes conductive layers at different vertical levels and conductive vias electrically connecting the conductive layers with each other. For example, the conductive interconnect structure 320 of the package substrate 310 may include a first upper conductive layer 321 on the top surface of the base layer 311, a second upper conductive layer 325 on the top surface of the upper insulating layer 312, a first lower conductive layer 323 on the bottom surface of the base layer 311, and a second lower conductive layer 327 on the bottom surface of the lower insulating layer 313. The first upper conductive layer 321, the second upper conductive layer 325, the first lower conductive layer 323, and the second lower conductive layer 327 may be electrically connected to one another through conductive vias, which pass through at least one selected from the base layer 311, the upper insulating layer 312, and the lower insulating layer 313.

An inter-package connector 391 may be between the package substrate 310 of the upper package UP and the upper redistribution structure 160 of the lower package LP. An upper portion of the inter-package connector 391 may be connected to the second lower conductive layer 327 through an opening of the lower protection layer 315 of the package substrate 310. A lower portion of the inter-package connector 391 may be connected to the upper redistribution line pattern 163L through an opening of the upper redistribution insulating layer 161. For example, the inter-package connector 391 may include or may be formed of solder.

The third semiconductor chip 330 may be on the package substrate 310. For example, a chip pad 331 of the third semiconductor chip 330 may be electrically connected to the second upper conductive layer 325 of the package substrate 310 through a chip connection bump 341. An underfill material layer 342 surrounding the chip connection bump 341 may be between the third semiconductor chip 330 and the package substrate 310. In some example embodiments, the third semiconductor chip 330 may correspond to a semiconductor memory chip. In some example embodiments, the third semiconductor chip 330 may correspond to a semiconductor logic chip. In example embodiments, one of the second and third semiconductor chips 130 and 330 may be a logic chip, and the other may be a memory chip. The third semiconductor chip 330 is connected to the second semiconductor chip 130, which is provided in a face-up manner, through a relatively short wiring path, and accordingly, the characteristics of signal transmission between the second and third semiconductor chips 130 and 330 may be improved.

The upper molding layer 343 may be provided on the package substrate 310 to cover at least a portion of the third semiconductor chip 330. For example, the upper molding layer 343 may include or may be formed of epoxy-group molding resin or polyimide-group molding resin. For example, the upper molding layer 343 may include or may be formed of an EMC.

FIGS. 11A through 11G are cross-sectional views illustrating stages of a method of manufacturing a semiconductor package, according to example embodiments. A method of manufacturing the semiconductor package 1005 of FIG. 10 will be described below with reference to FIGS. 11A through 11G.

Figure 11A:
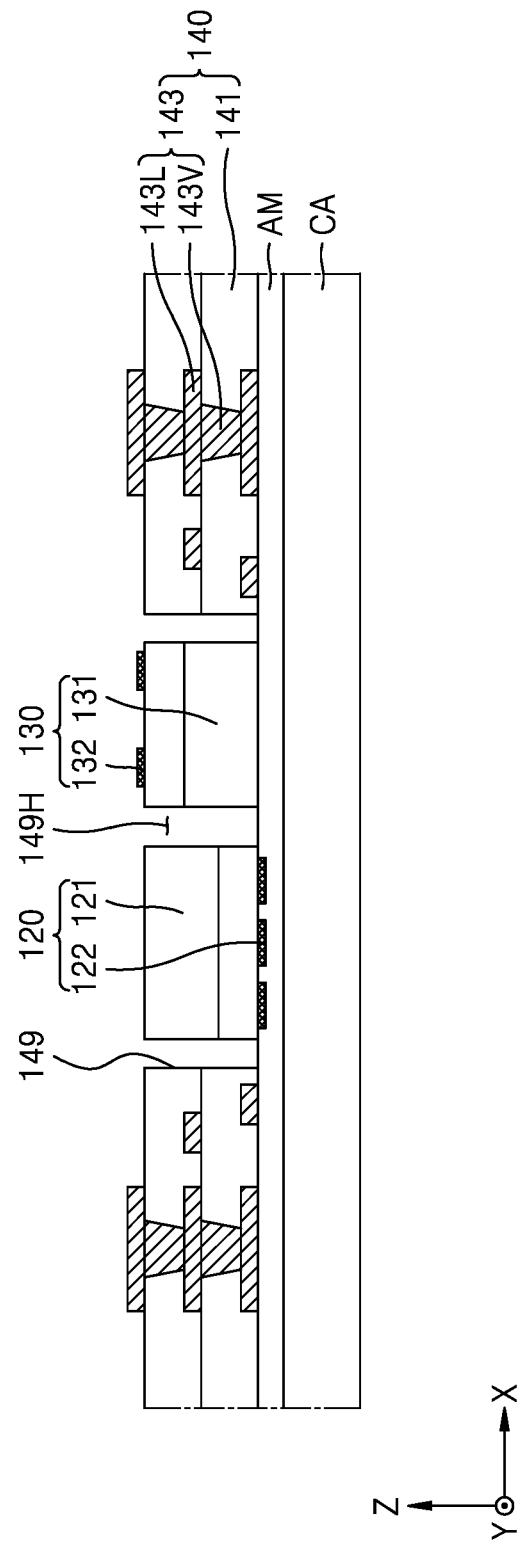
FIGS. 11A through 11G are cross-sectional views illustrating stages of a method of manufacturing a semiconductor package, according to example embodiments.

Referring to FIG. 11A, the connection substrate 140 is positioned on a carrier substrate CA. An adhesive material layer AM, such as a release film, may be formed on a surface of the carrier substrate CA, to which the connection substrate 140 is attached. The connection substrate 140 may include the accommodation space 149H. To form the accommodation space 149H of the connection substrate 140, a preliminary connection substrate having a flat shape may be prepared, and at least one selected from dry etching, wet etching, drill bit drilling, and laser drilling may be performed on the preliminary connection substrate such that the accommodation space 149H is formed in the connection substrate 140.

After the connection substrate 140 is positioned on the carrier substrate CA, the first semiconductor chip 120 and the second semiconductor chip 130 are mounted on the carrier substrate CA to be accommodated in accommodation space 149H. The first semiconductor chip 120 may be mounted on the carrier substrate CA such that a surface of the first semiconductor chip 120, which has the first chip pad 122 thereon, faces the carrier substrate CA. The second semiconductor chip 130 may be mounted on the carrier substrate CA such that a surface of the second semiconductor chip 130, which has the second chip pad 132 thereon, faces upwards.

Figure 11B:
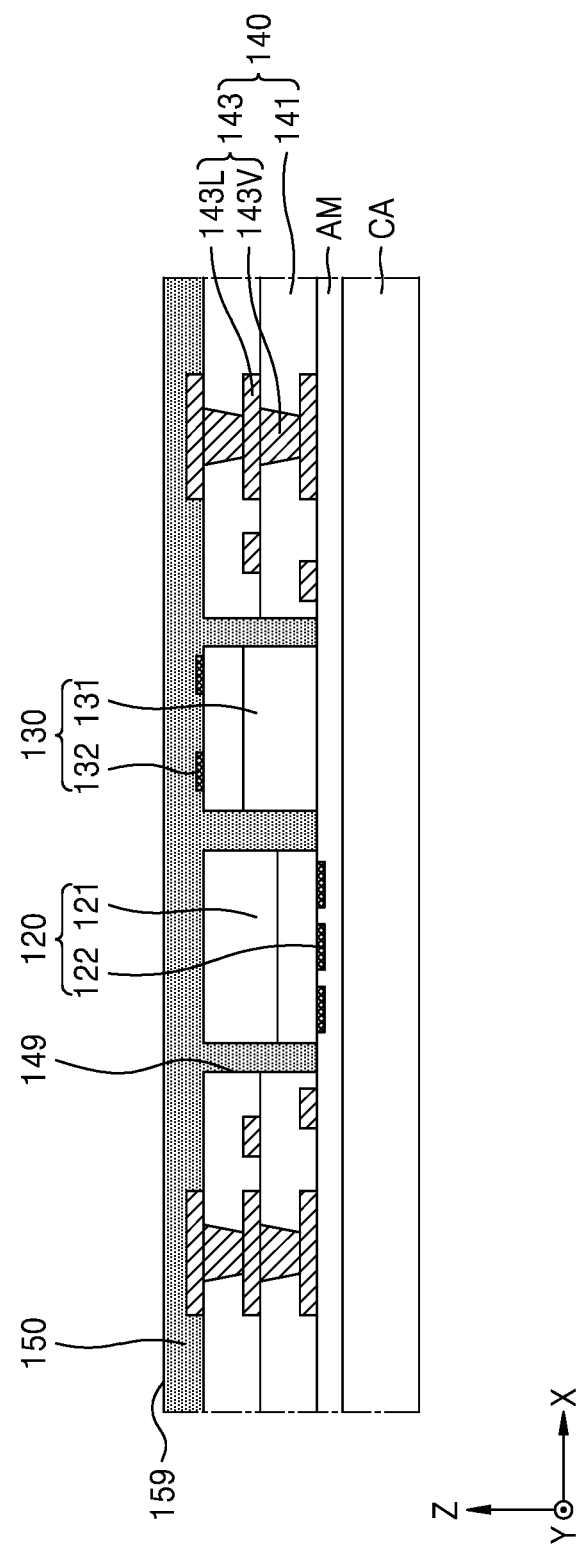

Referring to FIGS. 11A and 11B, the molding layer 150, which covers the first semiconductor chip 120, the second semiconductor chip 130, and the connection substrate 140, is formed on the carrier substrate CA. The molding layer 150 may fill the accommodation space 149H of the connection substrate 140, and thus may fill a gap between the first semiconductor chip 120 and the second semiconductor chip 130, a gap between the first semiconductor chip 120 and the inner wall 149 of the connection substrate 140, and a gap between the second semiconductor chip 130 and the inner wall 149 of the connection substrate 140. To form the molding layer 150, a molding material may be formed to cover the first semiconductor chip 120, the second semiconductor chip 130, and the connection substrate 140, and then, a planarization process such as a chemical mechanical polishing (CMP) process may be performed such that a flat surface is formed at an upper portion of the molding material. Through the planarization process, the molding layer 150 may have the top surface 159 that is planarized for subsequent processes.

Figure 11C:
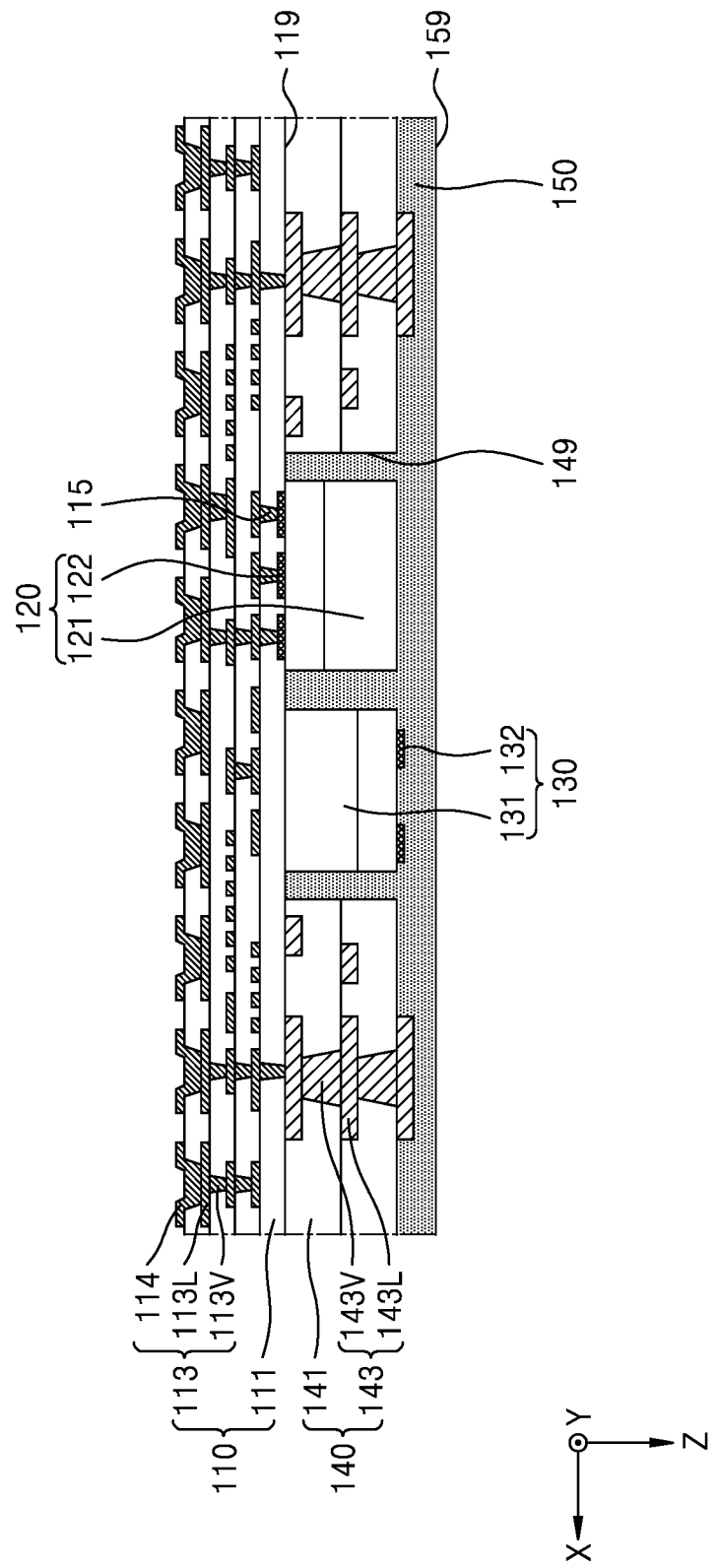

Referring to FIGS. 11B and 11C, after the molding layer 150 is formed, the carrier substrate CA is removed from the resultant structure of FIG. 11B, and the lower redistribution structure 110 is formed on an exposed surface resulting from the removal of the carrier substrate CA.

The lower redistribution structure 110 may include a plurality of lower redistribution insulating layers 111 and the lower redistribution pattern 113. The lower redistribution insulating layers 111 may be sequentially stacked on each of the connection substrate 140, the first semiconductor chip 120, the second semiconductor chip 130, and the molding layer 150 in the vertical direction (e.g., the Z direction). The lower redistribution pattern 113 may be insulated from another lower redistribution pattern by using the lower redistribution insulating layers 111. To form the lower redistribution structure 110, a first operation of forming a lower redistribution insulating layer 111 having a plurality of via holes and a second operation of forming a lower redistribution via pattern 113V filling each of the via holes of the lower redistribution insulating layer 111 and a lower redistribution line pattern 113L extending along a surface of the lower redistribution insulating layer 111 may be performed, and thereafter, the first and second operations may be repeated multiple times.

Figure 11D:
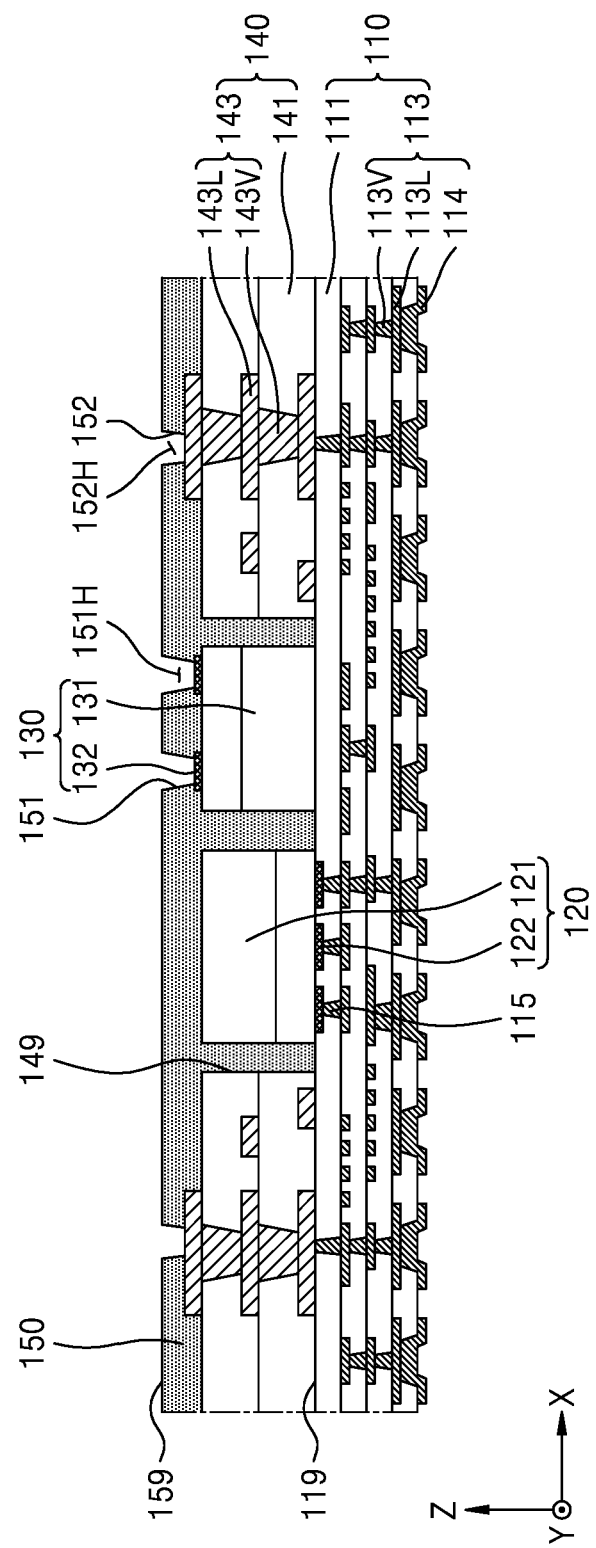

Referring to FIG. 11D, after the resultant structure of FIG. 11C may be turned upside down, the first via hole 151H exposing the second chip pad 132 of the second semiconductor chip 130 and the second via hole 152H exposing the conductive connection structure 143 of the connection substrate 140 may be formed in the molding layer 150. In example embodiments, to form the first via hole 151H and the second via hole 152H, a laser drilling process or an etching process may be performed to partially remove the molding layer 150.

In example embodiments, when the first via hole 151H and the second via hole 152H are formed in the molding layer 150 using a laser drilling process, the profile of the first side wall 151 of the molding layer 150, which defines the first via hole 151H, and the profile of the second side wall 152 of the molding layer 150, which defines the second via hole 152H, may be controlled by controlling the characteristics or focal position of a laser or the like. In example embodiments, the molding layer 150 may include or may be formed of a thermosetting material to be suitable for forming the first via hole 151H and the second via hole 152H using a laser drilling process.

Figure 11E:
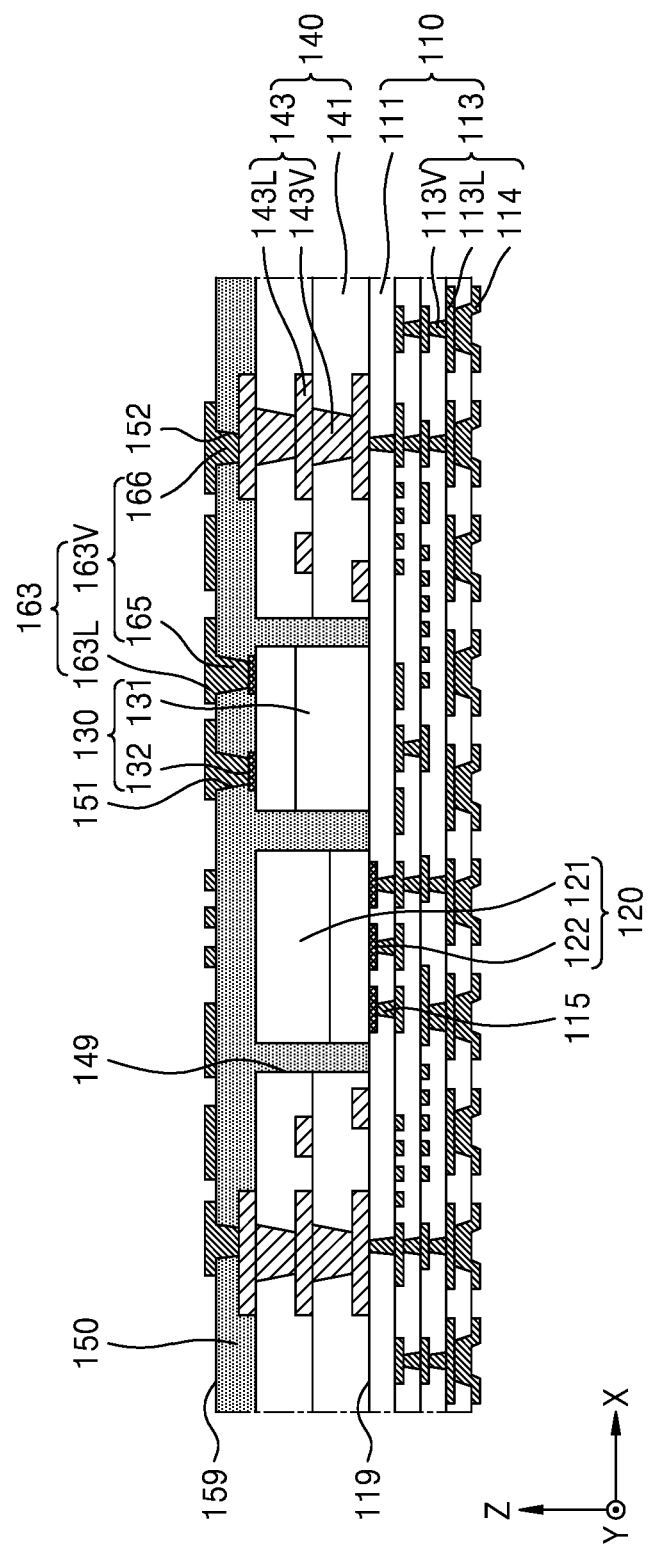

Referring to FIG. 11E, the upper redistribution pattern 163, which is electrically connected to the second chip pad 132 of the second semiconductor chip 130 and the conductive connection structure 143 of the connection substrate 140, is formed. The upper redistribution pattern 163 may include the first upper redistribution via pattern 165 filling the first via hole 151H, the second upper redistribution via pattern 166 filling the second via hole 152H, and the upper redistribution line pattern 163L extending along the top surface 159 of the molding layer 150. The first upper redistribution via pattern 165, the second upper redistribution via pattern 166, and the upper redistribution line pattern 163L may be formed together using the same metal interconnect process in which a metal layer is formed at the molding layer 150, filling the first via hole 151H and the second via hole 152H, and then the metal layer is patterned to form the upper redistribution line pattern 163L. Portions of the metal layer filling the first via hole 151H and the second via hole 152H correspond to the first upper redistribution via pattern 165 and second upper redistribution via pattern 166, respectively. Furthermore, because the first upper redistribution via pattern 165 electrically connected to the second semiconductor chip 130 mounted in the face-down manner is formed using the same process as another redistribution via pattern (e.g., the second upper redistribution via pattern 166) of the upper redistribution structure 160, an additional process that may be required by mounting the second semiconductor chip 130 in the face-up manner is not necessary. Accordingly, the semiconductor package 1005 having high electrical characteristics may be manufactured at low cost.

Figure 11F:
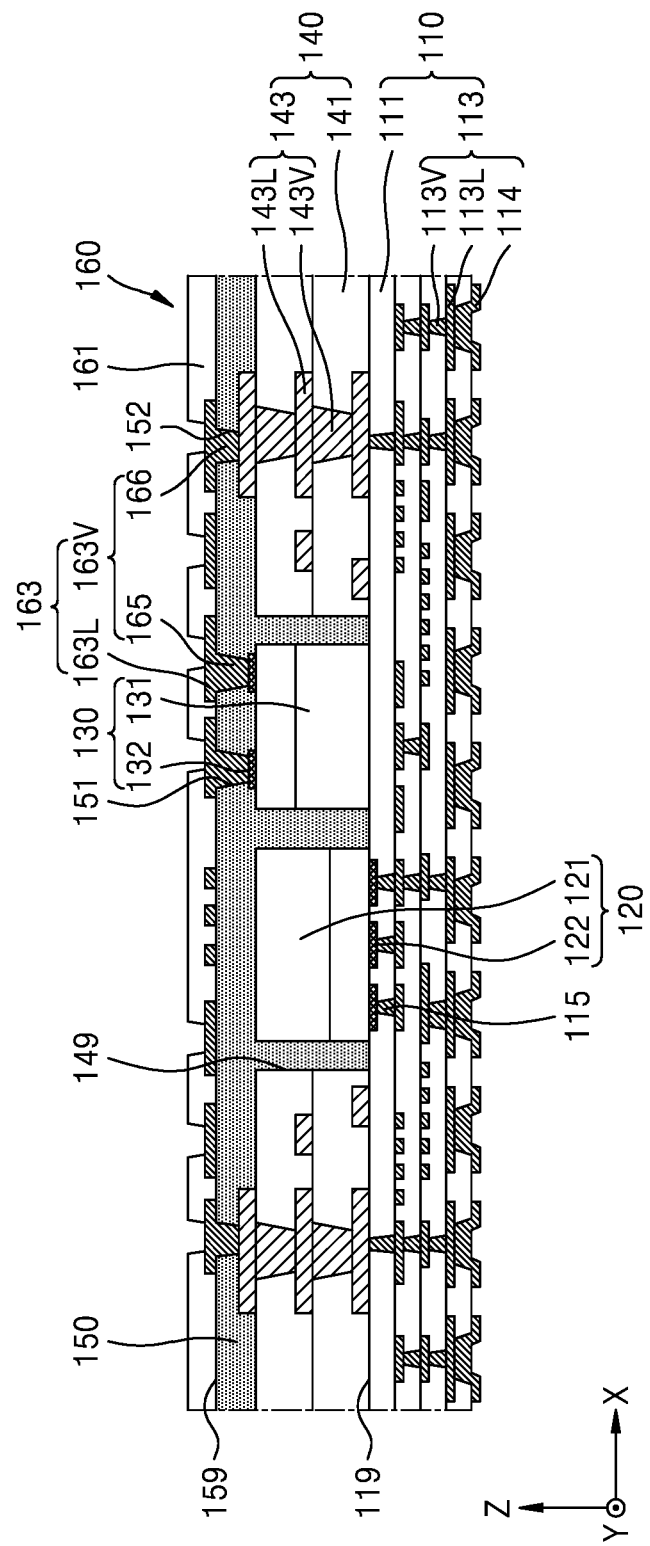

Referring to FIG. 11F, the upper redistribution insulating layer 161 is formed on the top surface 159 of the molding layer 150. To form the upper redistribution insulating layer 161, an insulating material layer covering the top surface 159 of the molding layer 150 and the upper redistribution line pattern 163L may be formed, and an opening exposing a portion of the upper redistribution line pattern 163L may be formed by partially removing the insulating material layer.

Figure 11G:
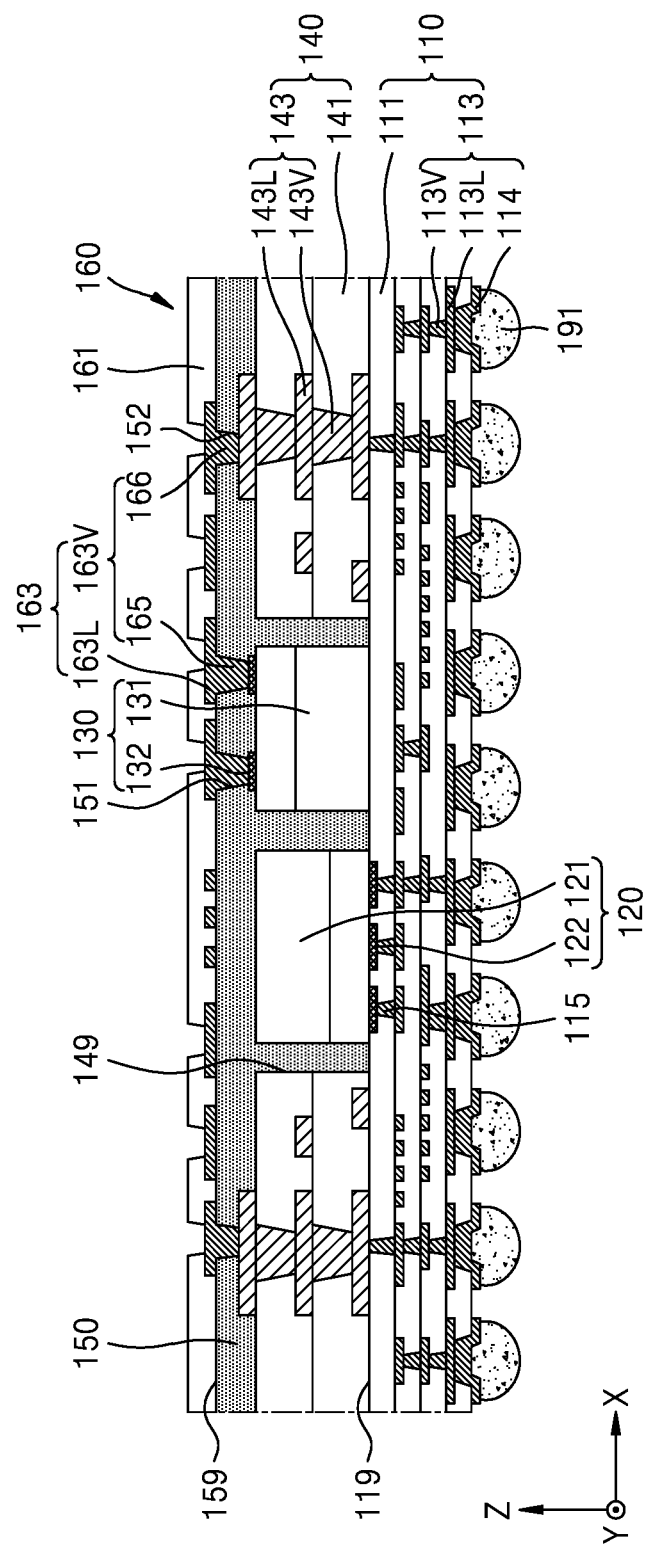

Referring to FIG. 11G, an external connector 191 may be formed on each of the external connection pads 114 of the lower redistribution structure 110, as shown in FIG. 10. After the external connector 191 is formed, a sawing process may be performed such that a structure manufactured at a panel level is separated into individual package unit structures.

Thereafter, referring to FIG. 10, the upper package UP may be attached to the upper redistribution structure 160. The upper package UP may be attached to the upper redistribution structure 160 through the inter-package connector 391 between the package substrate 310 of the upper package UP and the upper redistribution structure 160. The inter-package connector 391 may be connected to the upper redistribution line pattern 163L exposed by the opening of the upper redistribution insulating layer 161.

According to example embodiments, the semiconductor package 1005 may include the first semiconductor chip 120, which is mounted on the lower redistribution structure 110 in a face-down manner, and the second semiconductor chip 130, which is mounted on the lower redistribution structure 110 in a face-up manner. When a semiconductor chip for minimizing the length of a routing path to the third semiconductor chip 330 of the upper package UP is positioned in a face-up manner like the second semiconductor chip 130 and a semiconductor chip for minimizing the length of a routing path to an external device is positioned in a face-down manner like the first semiconductor chip 120, the electrical characteristics of the semiconductor package 1005 may be improved.

Furthermore, because the first upper redistribution via pattern 165 electrically connected to the second semiconductor chip 130 mounted in the face-down manner is formed using the same process as another redistribution via pattern (e.g., the second upper redistribution via pattern 166) of the upper redistribution structure 160, an additional process that may be required by mounting the second semiconductor chip 130 in the face-up manner is not necessary. Accordingly, the semiconductor package 1005 having high electrical characteristics may be manufactured at low cost.

While the inventive concept has been particularly shown and described with reference to embodiments thereof, it will be understood that various changes in form and details may be made therein without departing from the spirit and scope of the following claims.

What is claimed is:
1. A semiconductor package comprising:
a first semiconductor chip including a first semiconductor substrate and a first chip pad, the first semiconductor substrate including a first bottom surface and a first top surface that is opposite to the first bottom surface, and the first chip pad being on the first bottom surface of the first semiconductor substrate;
a second semiconductor chip including a second semiconductor substrate and a second chip pad, the second semiconductor substrate including a second bottom surface and a second top surface that is opposite to the second bottom surface, and the second chip pad being on the second top surface of the second semiconductor substrate;

a lower redistribution structure provided under the first semiconductor chip and the second semiconductor chip, the lower redistribution structure including a lower redistribution insulating layer and a lower redistribution pattern, the lower redistribution pattern including a first lower redistribution via pattern contacting the first chip pad of the first semiconductor chip;

a connection substrate on a top surface of the lower redistribution structure and including and a conductive connection structure and a substrate base having an accommodation space exposing the top surface of the lower redistribution structure and accommodating the first semiconductor chip and the second semiconductor chip therein, wherein the conductive connection structure passes through the substrate base;

a molding layer covering the first semiconductor chip and the second semiconductor chip;

an upper redistribution structure including an upper redistribution insulating layer and an upper redistribution pattern, the upper redistribution pattern including an upper redistribution line pattern and a first upper redistribution via pattern, the upper redistribution line pattern extending along a top surface of the molding layer, and the first upper redistribution via pattern extending from the top surface of the molding layer toward the second semiconductor chip and being connected to the second chip pad of the second semiconductor chip; and a conductive connection structure electrically connecting the lower redistribution pattern of the lower redistribution structure to the upper redistribution pattern of the upper redistribution structure, wherein the first upper redistribution via pattern has a tapered shape having a horizontal width decreasing toward the second chip pad of the second semiconductor chip, and wherein the first lower redistribution via pattern has a tapered shape having a horizontal width decreasing toward the first chip pad of the first semiconductor chip.

2. The semiconductor package of claim 1,
wherein a maximum horizontal width of the first upper redistribution via pattern is greater than a maximum horizontal width of the first lower redistribution via pattern.

3. The semiconductor package of claim 2,
wherein a horizontal width of the second chip pad of the second semiconductor chip is greater than a horizontal width of the first chip pad of the first semiconductor chip.

4. The semiconductor package of claim 1,
wherein the upper redistribution pattern further includes a second upper redistribution via pattern extending from the top surface of the molding layer and being connected to the conductive connection structure of the connection substrate, and
wherein the second upper redistribution via pattern has a tapered shape having a horizontal width decreasing toward the connection substrate.

5. The semiconductor package of claim 1,
wherein the connection substrate further includes an isolation wall between the first semiconductor chip and the second semiconductor chip.

6. The semiconductor package of claim 1,
wherein each of the first semiconductor chip, the second semiconductor chip, and the connection substrate contacts a top surface of the lower redistribution structure.

7. The semiconductor package of claim 1,
wherein the first semiconductor chip further includes:

a first through electrode passing through the first semiconductor substrate; and
a first electrode pad on the first top surface of the first semiconductor substrate, the first electrode pad being connected to the first through electrode, and
wherein the upper redistribution pattern further includes:
a third upper redistribution via pattern extending from the top surface of the molding layer and connected to the first electrode pad.

8. The semiconductor package of claim 1,
wherein the second semiconductor chip further includes:
a second through electrode passing through the second semiconductor substrate; and
a second electrode pad on the second bottom surface of the second semiconductor substrate, the second electrode pad being connected to the second through electrode, and
wherein the lower redistribution pattern further includes a second lower redistribution via pattern connected to the second electrode pad.

9. The semiconductor package of claim 1, further comprising
a seed metal layer between the first upper redistribution via pattern and a first side wall of the molding layer and between the first upper redistribution via pattern and the second chip pad of the second semiconductor chip,
wherein the first side wall of the molding layer defines a first via hole having the first upper redistribution via pattern therein.

10. The semiconductor package of claim 1,
wherein the lower redistribution structure further includes a heat dissipation conductive layer contacting a bottom surface of the second semiconductor chip.

11. The semiconductor package of claim 1, further comprising
a third semiconductor chip on the upper redistribution structure, the third semiconductor chip being electrically connected to the upper redistribution pattern.

12. The semiconductor package of claim 11,
wherein the first semiconductor chip is electrically connected to the third semiconductor chip through an electrical connection path formed by using the lower redistribution pattern, the conductive connection structure, and the upper redistribution pattern; and
wherein the second semiconductor chip is electrically connected to the third semiconductor chip through the upper redistribution pattern.

13. The semiconductor package of claim 1,
wherein the molding layer includes a thermosetting material.

14. A semiconductor package comprising:
a first semiconductor chip including a first semiconductor substrate and a first chip pad, the first semiconductor substrate including a first bottom surface and a first top surface that is opposite to the first bottom surface, and the first chip pad being on the first bottom surface of the first semiconductor substrate;
a second semiconductor chip including a second semiconductor substrate and a second chip pad, the second semiconductor substrate including a second bottom surface and a second top surface that is opposite to the second bottom surface, and the second chip pad being on the second top surface of the second semiconductor substrate;
a lower redistribution structure provided under the first semiconductor chip and the second semiconductor chip, the lower redistribution structure including a lower redistribution insulating layer and a lower redistribution pattern, the lower redistribution pattern including a first lower redistribution via pattern contacting the first chip pad of the first semiconductor chip;
a molding layer covering the first semiconductor chip and the second semiconductor chip;
an upper redistribution structure including an upper redistribution insulating layer and an upper redistribution pattern, the upper redistribution pattern including an upper redistribution line pattern and a first upper redistribution via pattern, the upper redistribution line pattern extending along a top surface of the molding layer, and the first upper redistribution via pattern extending from the top surface of the molding layer and being connected to the second chip pad of the second semiconductor chip; and
a conductive connection structure electrically connecting the lower redistribution pattern of the lower redistribution structure to the upper redistribution pattern of the upper redistribution structure,
wherein a horizontal width of the second chip pad of the second semiconductor chip is greater than a horizontal width of the first chip pad of the first semiconductor chip,
wherein a maximum horizontal width of the first upper redistribution via pattern is greater than a maximum horizontal width of the first lower redistribution via pattern,
wherein the first semiconductor chip further includes:
a first through electrode passing through the first semiconductor substrate; and
a first electrode pad on the first top surface of the first semiconductor substrate, the first electrode pad being connected to the first through electrode, and
wherein the upper redistribution pattern further includes:
a third upper redistribution via pattern extending from the top surface of the molding layer and connected to the first electrode pad.

15. The semiconductor package of claim 14,
wherein the first upper redistribution via pattern has a tapered shape having a horizontal width decreasing toward the second chip pad of the second semiconductor chip, and
wherein the first lower redistribution via pattern has a tapered shape having a horizontal width decreasing toward the first chip pad of the first semiconductor chip.

16. The semiconductor package of claim 15, further comprising:
an upper seed metal layer between the first upper redistribution via pattern and the second chip pad of the second semiconductor chip; and
a lower seed metal layer between the first lower redistribution via pattern and the first chip pad of the first semiconductor chip.

17. The semiconductor package of claim 15, further comprising:
a connection substrate including a substrate base and the conductive connection structure, the substrate base having an accommodation space accommodating the first semiconductor chip and the second semiconductor chip therein; and
a second upper redistribution via pattern extending from the top surface of the molding layer toward the conductive connection structure and being connected to the conductive connection structure,
wherein the second upper redistribution via pattern has a tapered shape having a horizontal width decreasing toward the connection substrate.

18. The semiconductor package of claim 14,
wherein the first semiconductor chip further includes:
a first passivation layer on the first top surface of the first semiconductor substrate;
a first electrode pad on the first passivation layer; and
a first through electrode passing through the first semiconductor substrate and the first passivation layer and connected to the first electrode pad, and
wherein the upper redistribution pattern further includes:
a third upper redistribution via pattern extending from the top surface of the molding layer toward the first electrode pad and being connected to the first electrode pad, the third upper redistribution via pattern having a tapered shape having a horizontal width decreasing toward the first electrode pad.

19. A semiconductor package comprising a lower package and an upper package stacked on the lower package,
wherein the lower package includes:
a first semiconductor chip including a first semiconductor substrate and a first chip pad, the first semiconductor substrate including a first bottom surface and a first top surface that is opposite to the first bottom surface, and the first chip pad being on the first bottom surface of the first semiconductor substrate;
a second semiconductor chip including a second semiconductor substrate and a second chip pad, the second semiconductor substrate including a second bottom surface and a second top surface that is opposite to the second bottom surface, and the second chip pad being on the second top surface of the second semiconductor substrate and having a horizontal width greater than a horizontal width of the first chip pad;
a lower redistribution structure including a top surface, a lower redistribution insulating layer, and a lower redistribution pattern, the top surface facing the first semiconductor chip and the second semiconductor chip, the lower redistribution pattern including a first lower redistribution via pattern contacting the first chip pad of the first semiconductor chip;
a connection substrate on the top surface of the lower redistribution structure and including a substrate base and a conductive connection structure, the substrate base having an accommodation space exposing the top surface of the lower redistribution structure and accommodating the first semiconductor chip and the second semiconductor chip therein, and the conductive connection structure passing through the substrate base;
a molding layer filling the accommodation space of the substrate base, covering the first semiconductor chip and the second semiconductor chip, and including a thermosetting material; and
an upper redistribution structure including:
an upper redistribution insulating layer covering a top surface of the molding layer; and
an upper redistribution pattern electrically connected to the lower redistribution pattern through the conductive connection structure,
wherein the upper redistribution pattern includes:
an upper redistribution line pattern extending along the top surface of the molding layer;

a first upper redistribution via pattern extending from the top surface of the molding layer to the second chip pad of the second semiconductor chip; and a second upper redistribution via pattern extending from the top surface of the molding layer to the conductive connection structure of the connection substrate, wherein the upper package includes:

a package substrate; and a third semiconductor chip on the package substrate, wherein a maximum horizontal width of the first upper redistribution via pattern is greater than a maximum horizontal width of the first lower redistribution via pattern, wherein the first upper redistribution via pattern has a tapered shape having a horizontal width decreasing toward the second chip pad of the second semiconductor chip, and wherein the first lower redistribution via pattern has a tapered shape having a horizontal width decreasing toward the first chip pad of the first semiconductor chip.

20. The semiconductor package of claim 1, wherein the lower redistribution pattern further includes a first lower redistribution line pattern extending along a bottom surface of the lower redistribution insulating layer, wherein a bottom surface of the first lower redistribution via pattern has a maximum horizontal width of the first lower redistribution via pattern and a top surface of the first lower redistribution via pattern has a maximum horizontal width of the first lower redistribution via pattern, wherein the top surface of the first lower redistribution via pattern contacts the first chip pad of the first semiconductor chip, and wherein the bottom surface of the first lower redistribution via pattern contacts the first lower redistribution line pattern.

* * * * *